(12) United States Patent
Sakai et al.

(10) Patent No.: US 11,394,143 B2
(45) Date of Patent: Jul. 19, 2022

(54) CONNECTOR

(71) Applicant: SUMITOMO WIRING SYSTEMS, LTD., Mie (JP)

(72) Inventors: Hiroto Sakai, Mie (JP); Yuichi Nakanishi, Mie (JP); Hidekazu Matsuda, Mie (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 0 days.

(21) Appl. No.: 17/270,941

(22) PCT Filed: Aug. 21, 2019

(86) PCT No.: PCT/JP2019/032622
§ 371 (c)(1),
(2) Date: Feb. 24, 2021

(87) PCT Pub. No.: WO2020/050028
PCT Pub. Date: Mar. 12, 2020

(65) Prior Publication Data
US 2021/0328371 A1 Oct. 21, 2021

(30) Foreign Application Priority Data
Sep. 3, 2018 (JP) .............................. JP2018-164316

(51) Int. Cl.
*H01R 12/71* (2011.01)
*H01R 12/70* (2011.01)
(Continued)

(52) U.S. Cl.
CPC ......... *H01R 12/714* (2013.01); *H01R 12/707* (2013.01); *H01R 13/40* (2013.01); *H01R 13/502* (2013.01)

(58) Field of Classification Search
CPC .... H01R 12/714; H01R 12/707; H01R 13/40; H01R 13/502
See application file for complete search history.

(56) References Cited

U.S. PATENT DOCUMENTS

| 5,820,393 A | 10/1998 | Edgley et al. |
| 2007/0066117 A1 | 3/2007 | Sakamoto |

(Continued)

FOREIGN PATENT DOCUMENTS

| JP | 2010-176958 A | 8/2010 |
| JP | 2014-229383 A | 12/2014 |

(Continued)

OTHER PUBLICATIONS

International Search Report dated Oct. 8, 2019 for WO 2020/050028 A1 (4 pages).

*Primary Examiner* — Abdullah A Riyami
*Assistant Examiner* — Nader J Alhawamdeh
(74) *Attorney, Agent, or Firm* — Venjuris, P.C.

(57) ABSTRACT

A connector 10 disclosed by this specification is to be mounted on a circuit board having lands and includes a housing 12 to be connected to a mating housing, and a pair of pegs (board fixing portions) 16 to be respectively mounted into both side portions of the housing 12 and soldered and fixed to the lands. The pair of pegs 16 respectively have peg-side contact surfaces (fixing portion-side contact surfaces) 26S to be held in surface contact with a pair of housing-side contact surfaces 52S located on both side surfaces of the housing 12. The housing 12 includes a pair of first projections (projections) 64 projecting toward back surfaces 26B of the pair of pegs 16 on sides opposite to the peg-side contact surfaces 26S.

6 Claims, 29 Drawing Sheets

(51) Int. Cl.
*H01R 13/40* (2006.01)
*H01R 13/502* (2006.01)

(56) References Cited

U.S. PATENT DOCUMENTS

| | | |
|---|---|---|
| 2008/0057796 A1 | 3/2008 | Nakano |
| 2010/0112836 A1* | 5/2010 | Aihara ................. H01R 13/639 439/79 |
| 2012/0231637 A1 | 9/2012 | Takeuchi et al. |
| 2021/0328371 A1* | 10/2021 | Sakai ................... H01R 12/714 |

FOREIGN PATENT DOCUMENTS

| | | | |
|---|---|---|---|
| JP | 2014229383 A | * | 12/2014 |
| JP | 2016-018723 A | | 2/2016 |

* cited by examiner

FIG. 8
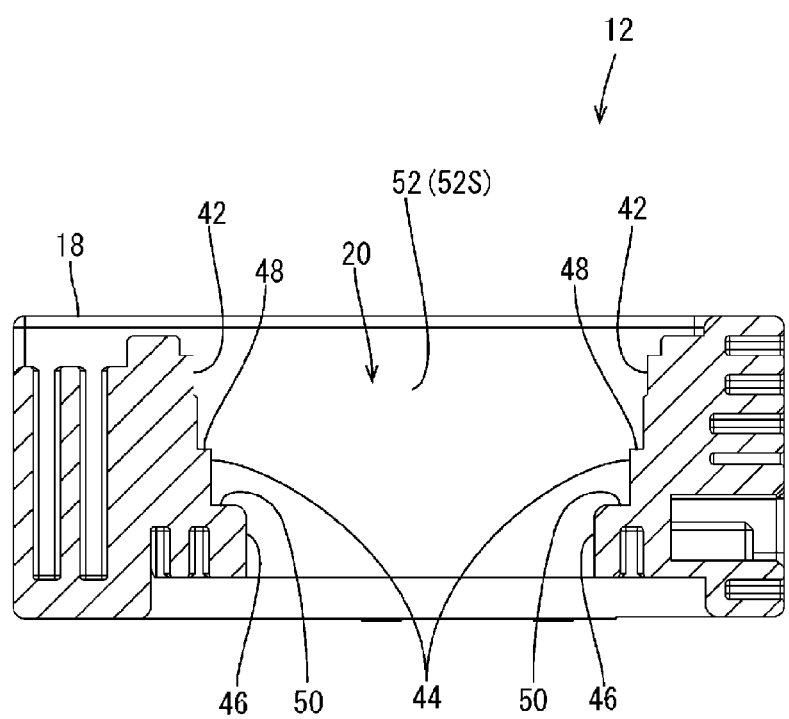
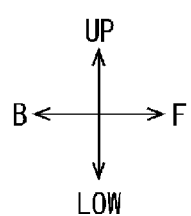

FIG. 13
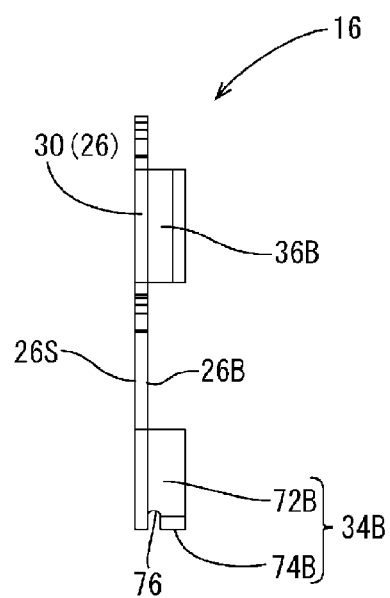
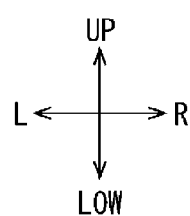

FIG. 20
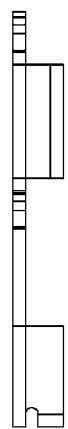
FIG. 21
FIG. 22
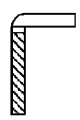 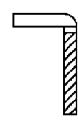

FIG. 28
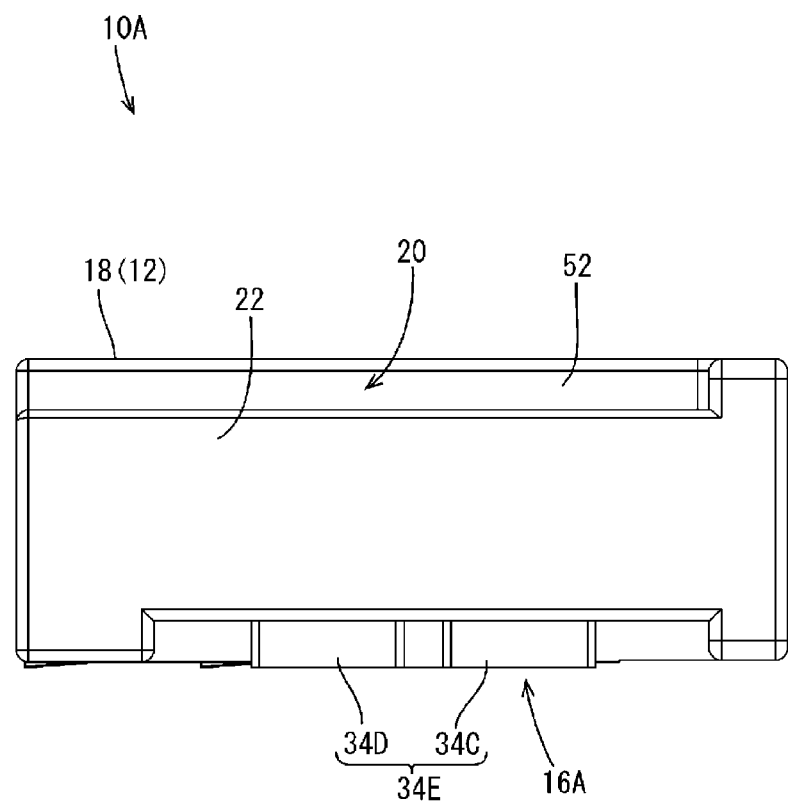
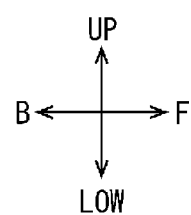

FIG. 30
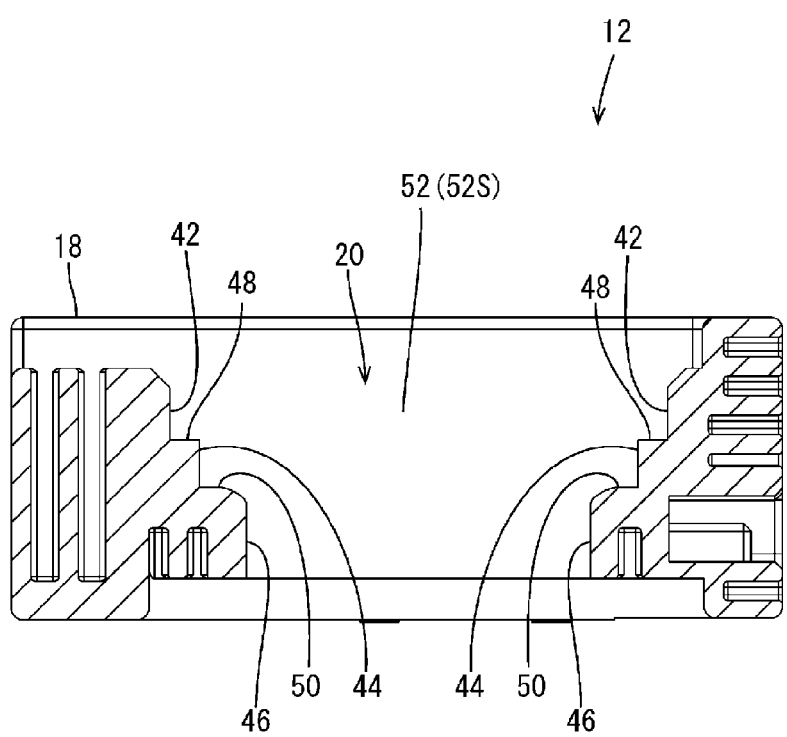
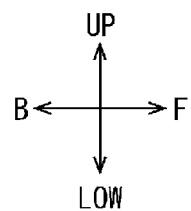

FIG. 31
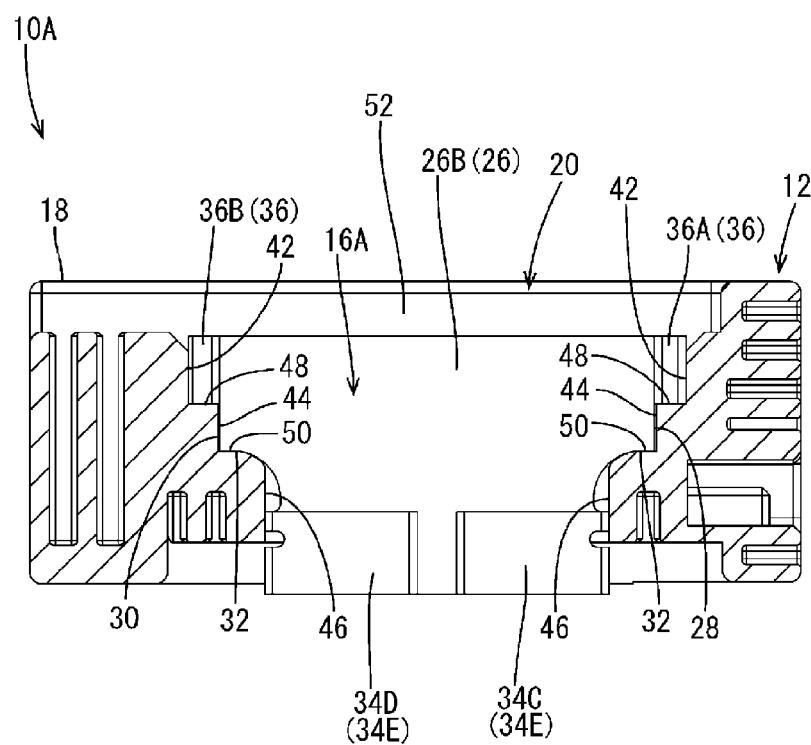
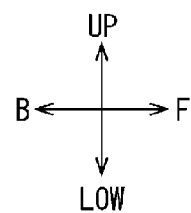

CONNECTOR

CROSS REFERENCE TO RELATED APPLICATIONS

This application is a national phase of PCT application No. PCT/JP2019/032622, filed on 21 Aug. 2019, which claims priority from Japanese patent application No. 2018-164316, filed on 3 Sep. 2018, all of which are incorporated herein by reference.

TECHNICAL FIELD

A technique disclosed by this specification relates to a connector.

BACKGROUND

An electrical connector described in Patent Document 1 below is known as an example of a conventional connector. This electrical connector includes an insulating housing to be mounted on a circuit board and a plurality of contacts made of metal and mounted in the housing.

The housing includes a body portion having a substantially rectangular parallelepiped shape and extending in a longitudinal direction, and a pair of projecting portions provided on both ends in the longitudinal direction of the body portion. Each projecting portion of the housing is formed with a peg mounting slot penetrating in a vertical direction. A solder peg made of metal for fixing the housing on the circuit board is mounted in each mounting slot. The lower surface of each solder peg is soldered to the circuit board by reflow soldering, whereby the housing is mounted on the circuit board.

PRIOR ART DOCUMENT

Patent Document

Patent Document 1: JP 2010-176958 A

SUMMARY OF THE INVENTION

Problems to be Solved

However, if the rigidity of the solder pegs decreases such as due to a reduction in the plate thickness of the solder pegs, the solder pegs are easily rolled and deformed when a stress is applied to the housing in a direction to peel off the solder pegs such as during connection to or disconnection from a mating housing. If the solder pegs are rolled and deformed, the housing is displaced. Thus, the stress concentrates on soldered parts of the metal contacts and the circuit board, thereby causing a problem of reducing connection reliability.

Means to Solve the Problem

A connector disclosed in this specification is a connector to be mounted on a circuit board having lands and includes a housing to be connected to a mating housing, and a pair of board fixing portions to be respectively mounted into both side portions of the housing and soldered and fixed to the lands, wherein the pair of board fixing portions respectively have fixing portion-side contact surfaces to be held in surface contact with a pair of housing-side contact surfaces located on both side surfaces of the housing, and the housing includes a pair of projections projecting toward back surfaces of the pair of board fixing portions on sides opposite to the fixing portion-side contact surfaces.

Since the board fixing portions have the fixing portion-side contact surfaces to be held in surface contact with the housing-side contact surfaces of the housing and the housing is provided with the projections projecting toward the back surfaces of the fixing portion-side contact surfaces, if the board fixing portion is going to be rolled and deformed in a direction from the fixing portion-side contact surface toward the back surface, the back surface contacts the projection. Thus, the rolling deformation of the board fixing portion can be suppressed.

Further, the housing may include a pair of plate-like protection walls provided to face the pair of housing-side contact surfaces, the board fixing portion may be provided between the housing-side contact surface and the protection wall, and the pair of projections may be provided to respectively project toward the pair of housing-side contact surfaces from the pair of protection walls.

Since the board fixing portion is provided between the housing-side contact surface and the protection wall, the back surface of the board fixing portion is covered by the protection wall and can be protected by the protection wall.

Further, the board fixing portion may be inserted between the housing-side contact surface and the protection wall and an end part in an inserting direction of the board fixing portion may be soldered and fixed to the land, and the projection may be composed of a projecting portion projecting toward the back surface of the board fixing portion and a thread rib provided on a tip part of the projecting portion, shaped to be long in the inserting direction of the board fixing portion and configured to linearly contact the back surface of the board fixing portion.

Since the thread rib configured to linearly contact the back surface of the board fixing portion is provided on the tip part of the projection, the thread rib is squeezed by the board fixing portion in inserting the board fixing portion between the housing-side contact surface and the protection wall. Thus, the board fixing portion can be reliably pressed.

Further, the board fixing portion may include a first folded portion formed by being folded from one end part toward another end part in a direction intersecting the inserting direction and a second folded portion formed by being folded from the other end part toward the one end part, and the projection of the housing may be located between the first folded portion and the second folded portion.

Since the projection is located between the first and second folded portions of the board fixing portion, the projection can be used to position the board fixing portion in inserting the board fixing portion between the housing-side contact surface and the protection wall.

Further, the board fixing portion may be inserted between the housing-side contact surface and the protection wall and an end part in an inserting direction of the board fixing portion may be soldered and fixed to the land, the board fixing portion may include a first folded portion having a plate-like side piece formed by being folded in a direction intersecting the fixing portion-side contact surface from one end part in a direction intersecting the inserting direction and a second folded portion having a plate-like side piece formed by being folded in a direction intersecting the fixing portion-side contact surface from another end part in the direction intersecting the inserting direction and provided to face the first folded portion, a bottom piece formed by being folded toward the second folded portion, disposed in parallel to the land and to be soldered and fixed to the land may be provided on an end part facing the land on the side piece of the first folded portion, and a bottom piece formed by being folded toward the first folded portion, disposed in parallel to the land and to be soldered and fixed to the land may be provided on an end part facing the land on the side piece of the second folded portion.

Since the bottom pieces are disposed in parallel to the land of the circuit board, a contact area with the land of the circuit board can be increased as compared to a configuration in which only end part in the inserting direction of the board fixing portion is placed on the land of the circuit board.

Further, a part between the side piece and the bottom piece may be curved into a round portion, a slit portion open in the inserting direction may be provided in an end part on the land side of the side piece, and a back end position on a side opposite to the land, out of an opening edge of the slit portion, may be located more away from the land than from the round portion.

Since the round portion is provided between the side piece and the bottom piece, a fillet of solder for fixing the board fixing portion and the land of the circuit board is formed along the round portion. Further, since the slit portion open in the inserting direction is provided in the end part of the side piece on the land side of the circuit board, the solder is sucked up into the slit portion by a capillary phenomenon and the fillet is formed over the entire slit portion. At this time, the back end position on the side opposite to the land of the circuit board, out of the opening edge of the slit portion, is located more away from the land of the circuit board than from the round portion, the fillet formed by the slit portion is larger than that formed by the round portion. By providing the slit portion in this way, a larger fillet can be formed as compared to the case where the slit portion is not provided.

Effect of the Invention

According to the connector disclosed in this specification, it is possible to suppress the rolling deformation of the board fixing portion.

BRIEF DESCRIPTION OF THE DRAWINGS

FIG. 8 is a section along A-A in FIG. 7.
FIG. 13 is a left side view of the peg.
FIG. 20 is a left side view of the peg.
FIG. 21 is a right side view of the peg.
FIG. 22 is a section along B-B in FIG. 18.
FIG. 28 is a side view of the connector.
FIG. 30 is a section along C-C in FIG. 29.
FIG. 31 is a view showing a state where the peg is mounted in FIG. 30.

DETAILED DESCRIPTION TO EXECUTE THE INVENTION

First Embodiment

Figure 1:
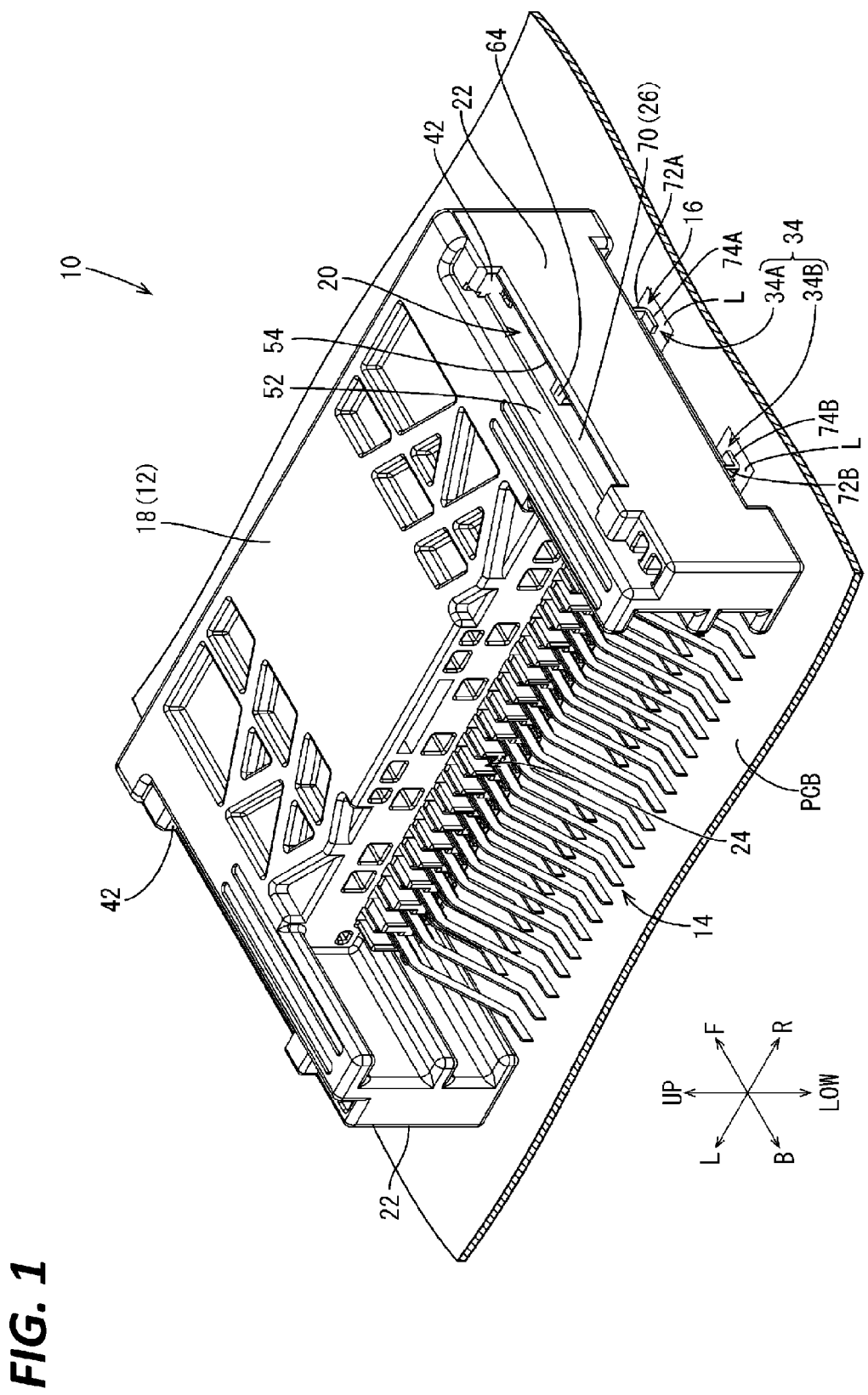
FIG. 1 is a perspective view of a connector of a first embodiment.
Figure 2:
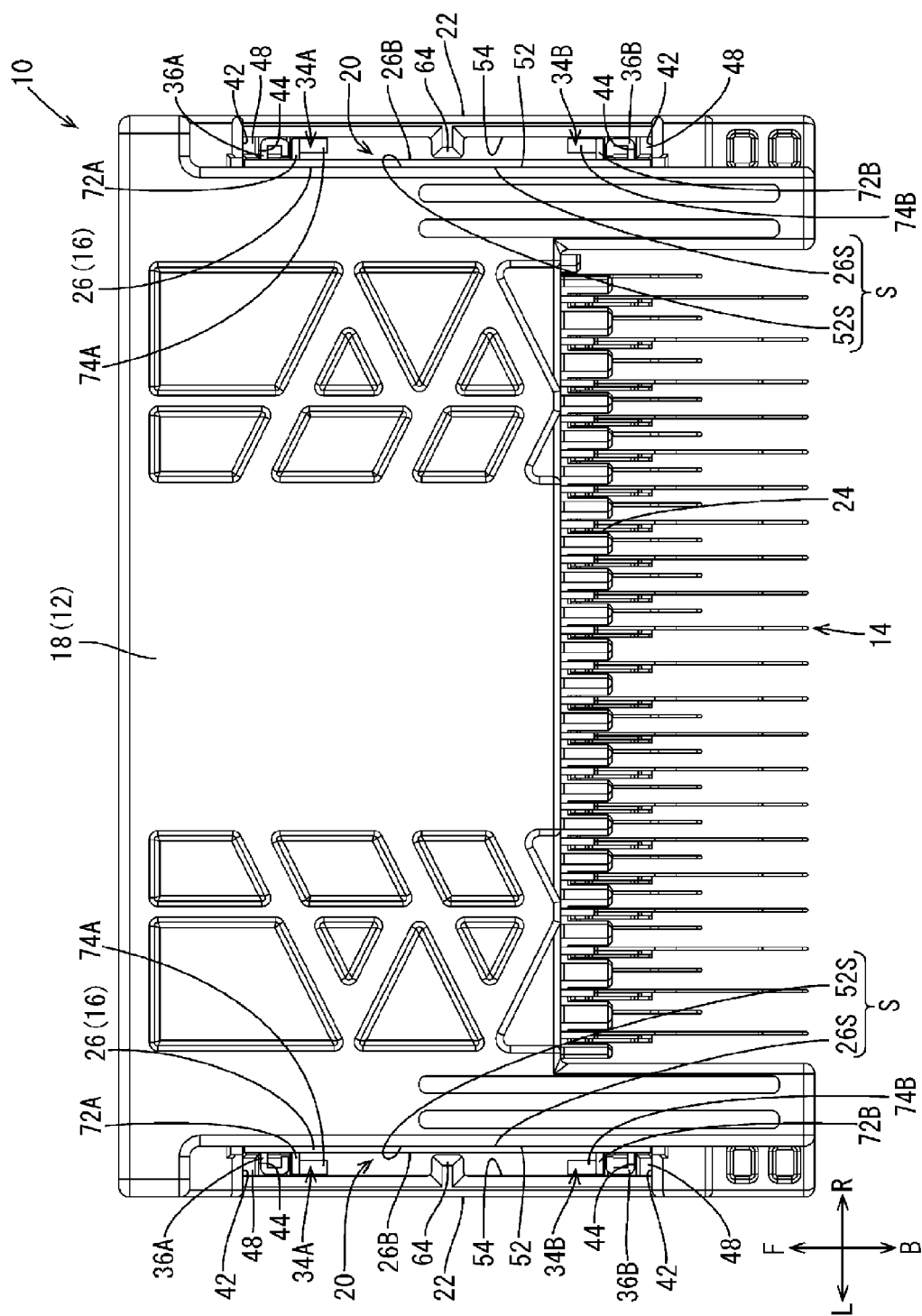
FIG. 2 is a plan view of the connector.

A first embodiment is described with reference to FIGS. 1 to 15. A connector 10 of this embodiment is a connector to be mounted on a circuit board PCB and includes, as shown in FIGS. 1 and 2, a housing 12 to be connected to a mating housing (not shown), a plurality of contact terminals 14 made of conductive metal and to be accommodated into the housing 12 and a pair of pegs (board fixing portions) 16 made of conductive metal. In the following description, a height direction of the housing 12 is referred to as a vertical direction, a connecting direction of the housing 12 is referred to as a front-back direction and a width direction of the housing 12 is referred to as a lateral direction as shown in FIGS. 1 to 15.

The housing 21 is made of insulating resin and includes a rectangular housing body portion 18 long in the lateral direction as shown in FIGS. 1 and 2. A pair of accommodating portions (both side portions) 20 are provided on both left and right sides of the housing body portion 18, and the pair of pegs 16 are respectively accommodated into the pair of accommodating portions 20 from above. Laterally outer walls of the pair of accommodating portions 20 serve as a pair of protection walls 22.

As shown in FIG. 1, a plurality of cavities 24 are open in the back end of the housing body portion 18, and the contact terminals 14 are respectively fixed to inner walls of the cavities 24 by press-fitting.

The contact terminal 14 is formed by pressing and bending a thin plate made of copper alloy, and has an elongated shape in the front-back direction as shown in FIGS. 1 and 2. A back part of the contact terminal 14 is exposed to outside from an opening of the cavity 24 and connected to a land L formed on a surface of the circuit board PCB by a print wiring technique.

Figure 10:
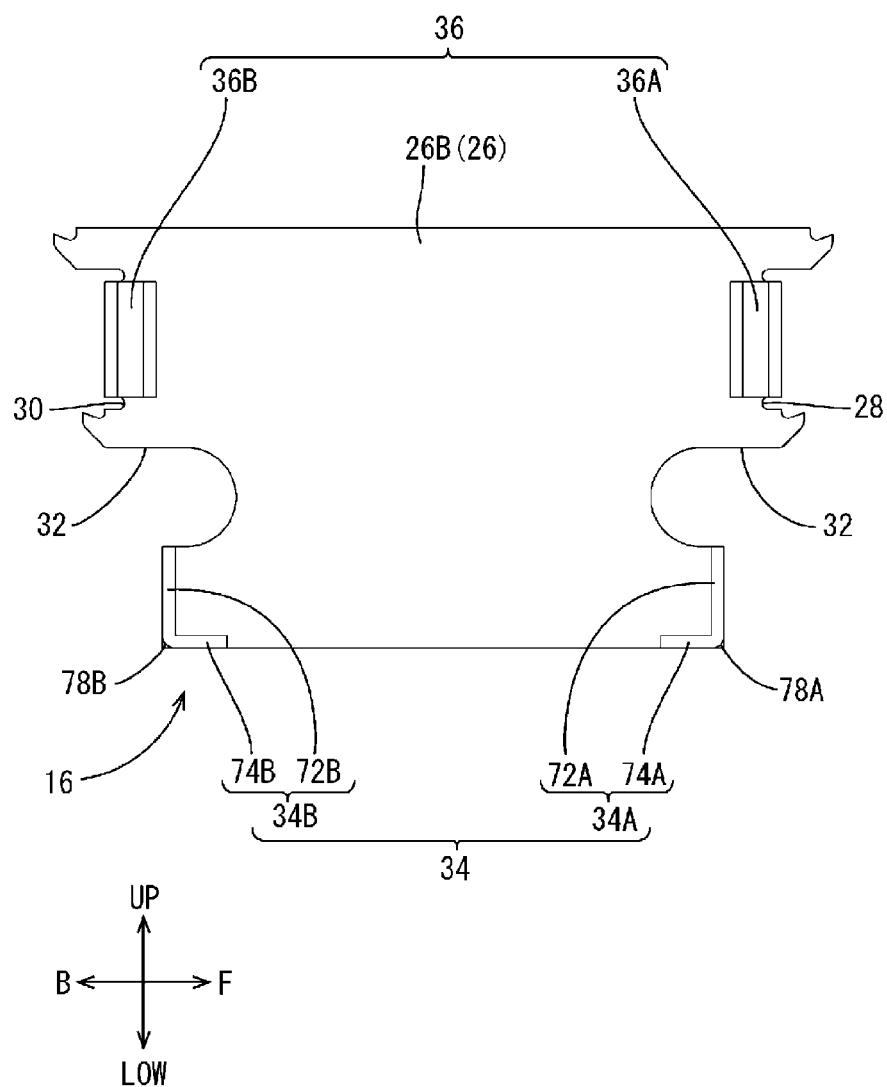
FIG. 10 is a front view of the peg.
Figure 11:
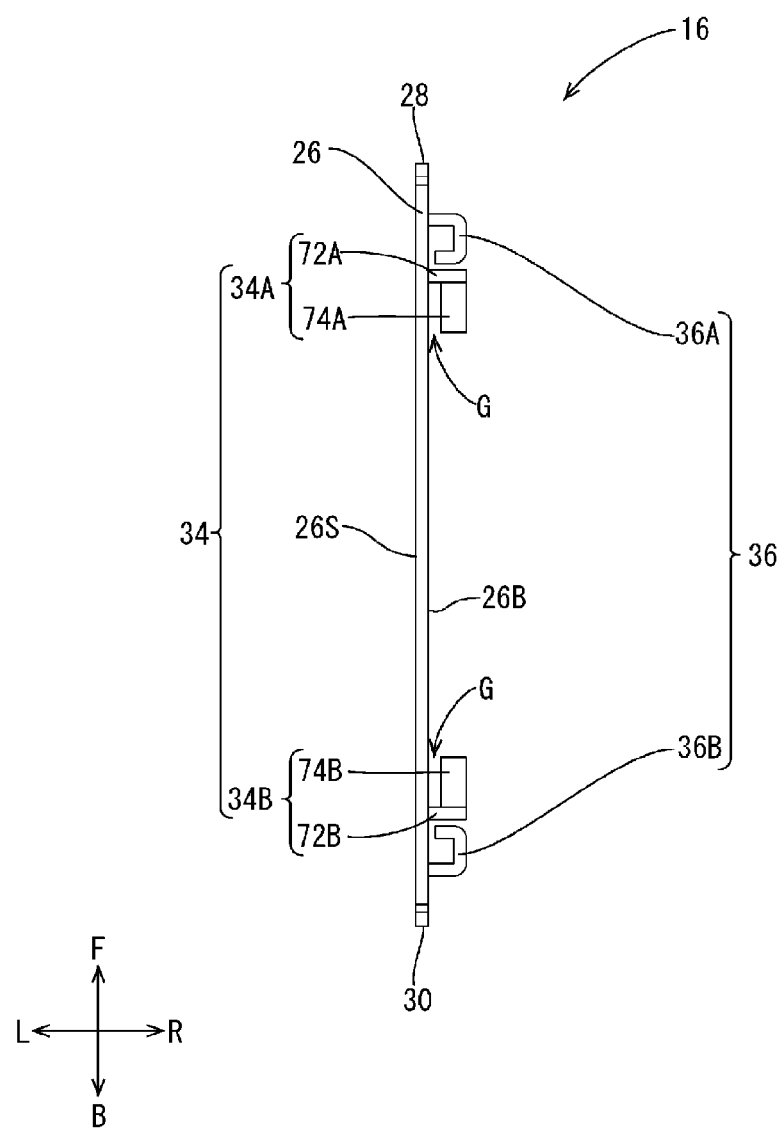
FIG. 11 is a plan view of the peg.

The peg 16 is formed by pressing and bending a plate having the same thickness as the plate of the contact terminal 14 and includes, as shown in FIGS. 10 and 11, a plate-like peg body portion 26, a pair of cut portions 32 formed by cutting substantially centers of a front end part 28 and a back end part 30 of the peg body portion 26 into a semicircular shape, a pair of folded portions 34 located below the pair of cut portions 32 and a pair of bent portions 36 located above the pair of cut portions 32.

Out of the pair of folded portions 34, the folded portion on a front side (first folded portion) 34A is connected to the front end part 28 of the peg body portion 26 and composed of a plate-like side piece 72A folded in a direction (rightward direction) intersecting the peg body portion 26 and a plate-like bottom piece 74A connected to the lower end of the side piece 72A and folded backward as shown in FIGS. 10 and 11. As shown in FIG. 10, a part between the side piece 72A and the bottom piece 74A is curved into a rounded portion 78A.

The folded portion on a back side (second folded portion) 34B is connected to the back end part 30 of the peg body portion 26 and composed of a plate-like side piece 72B folded in the direction (rightward direction) intersecting the peg body portion 26 and a plate-like bottom piece 74B connected to the lower end of the side piece 72B and folded forward. As shown in FIG. 10, a part between the side piece 72B and the bottom piece 74B is curved into a rounded portion 78B. As shown in FIGS. 13 and 15, a slit portion 76 cut into a semicircular shape is provided in the lower end of the side piece 72B on the side of the peg body portion 26. A position T of the upper end of the slit portion 76 is located above the round portion 78B as shown by a dotted line of FIGS. 14 and 15.

Out of the pair of bent portions 36, the bent portion 36A on the front side is formed by bending a piece projecting forward from the front end part 28 of the peg body portion 26 toward the back end part 30 as shown in FIG. 11. Further, the bent portion 36B on the back side is formed by bending a piece projecting backward from the back end part 30 of the peg body portion 26 toward the front end part 28.

Figure 9:
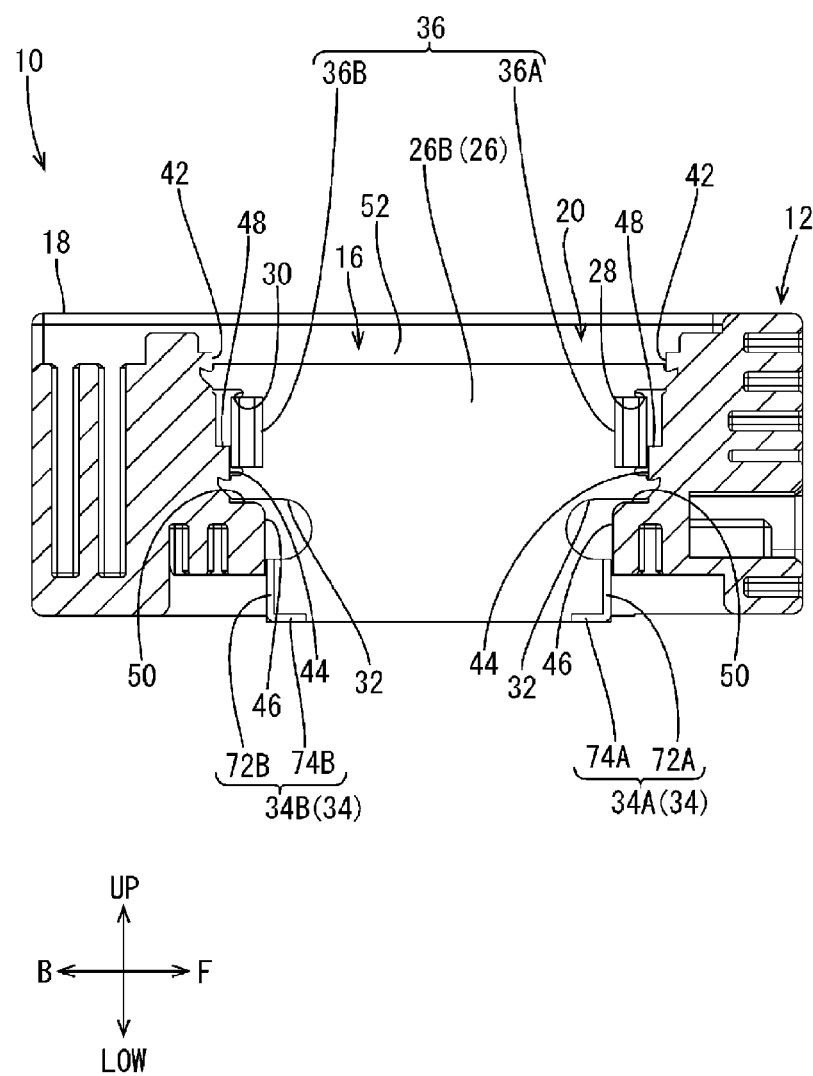
FIG. 9 is a view showing a state where the peg is mounted in FIG. 8.

As shown in FIGS. 8 and 9, front and back inner walls in the accommodating portion 20 are composed of a pair of first inner walls 42, a pair of second inner walls 44 located below the pair of first inner walls 42 and a pair of third inner walls 46 located below the pair of second inner walls 44. Further, the first and second inner walls 42, 44 are connected by first step portions 48, and the second and third inner walls 44, 46 are connected by second step portions 50.

Figure 7:
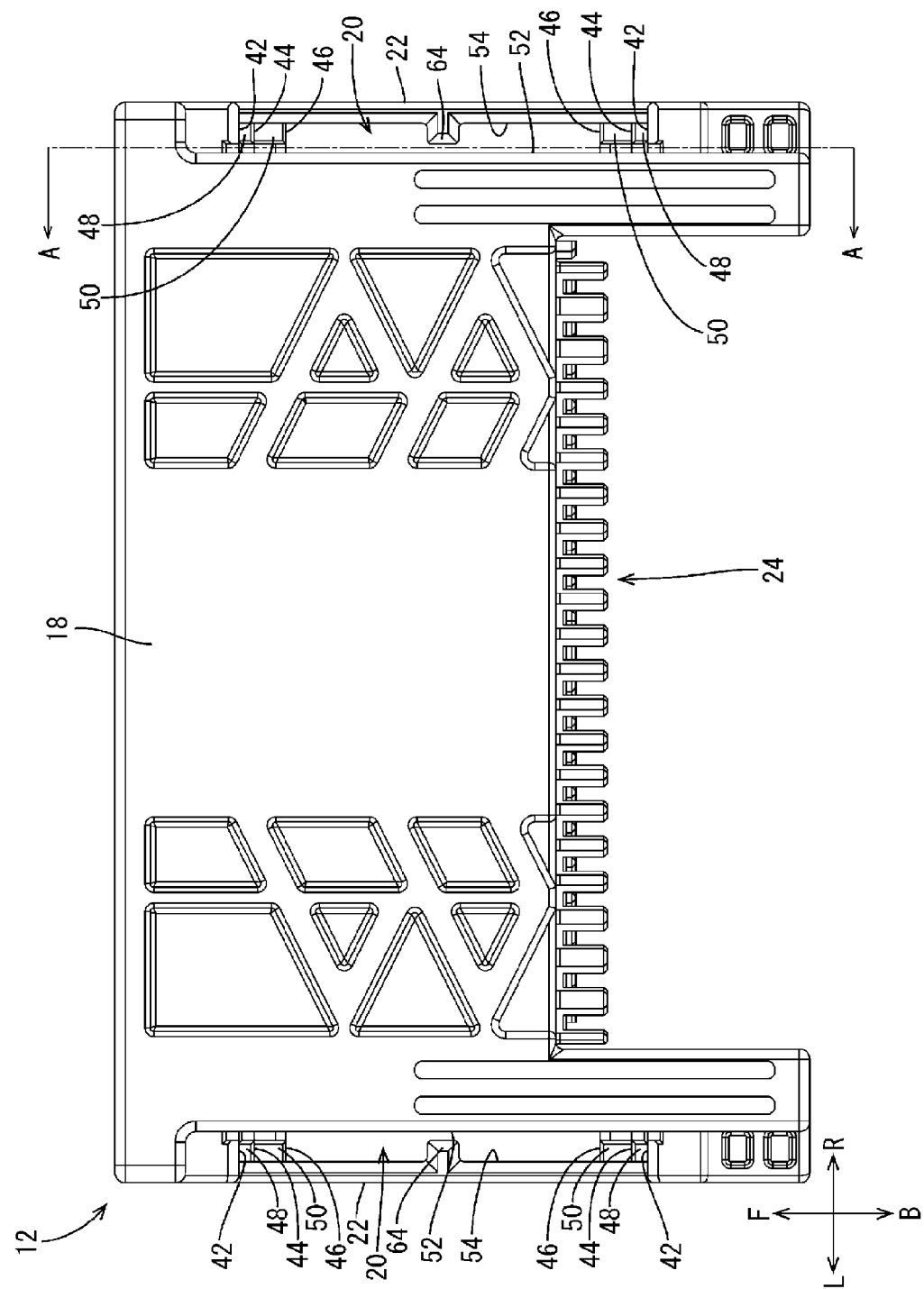
FIG. 7 is a plan view of the housing.

Left and right inner walls in the accommodating portion 20 are composed of fourth inner walls 52 constituting both side surfaces of the housing body portion 18 as shown in FIGS. 7 and 8, and fifth inner walls 54 provided to face the fourth inner walls 52 and constituting surfaces of the protection walls 22 on the side of the fourth inner walls 52 as shown in FIG. 7.

As shown in FIG. 9, the front folded portion 36A of the peg 16 can come into contact with the front second inner wall 44 from behind, and the rear folded portion 36B of the peg 16 can come into contact with the rear second inner wall 44 from front. In this way, a displacement of the peg in the front-back direction is restricted.

As shown in FIG. 9, upper end parts of the pair of cut portions 32 can respectively come into contact with the second step portions 50 from above, thereby preventing the peg 16 from falling down from the inside of the accommodating portion 20.

Figure 3:
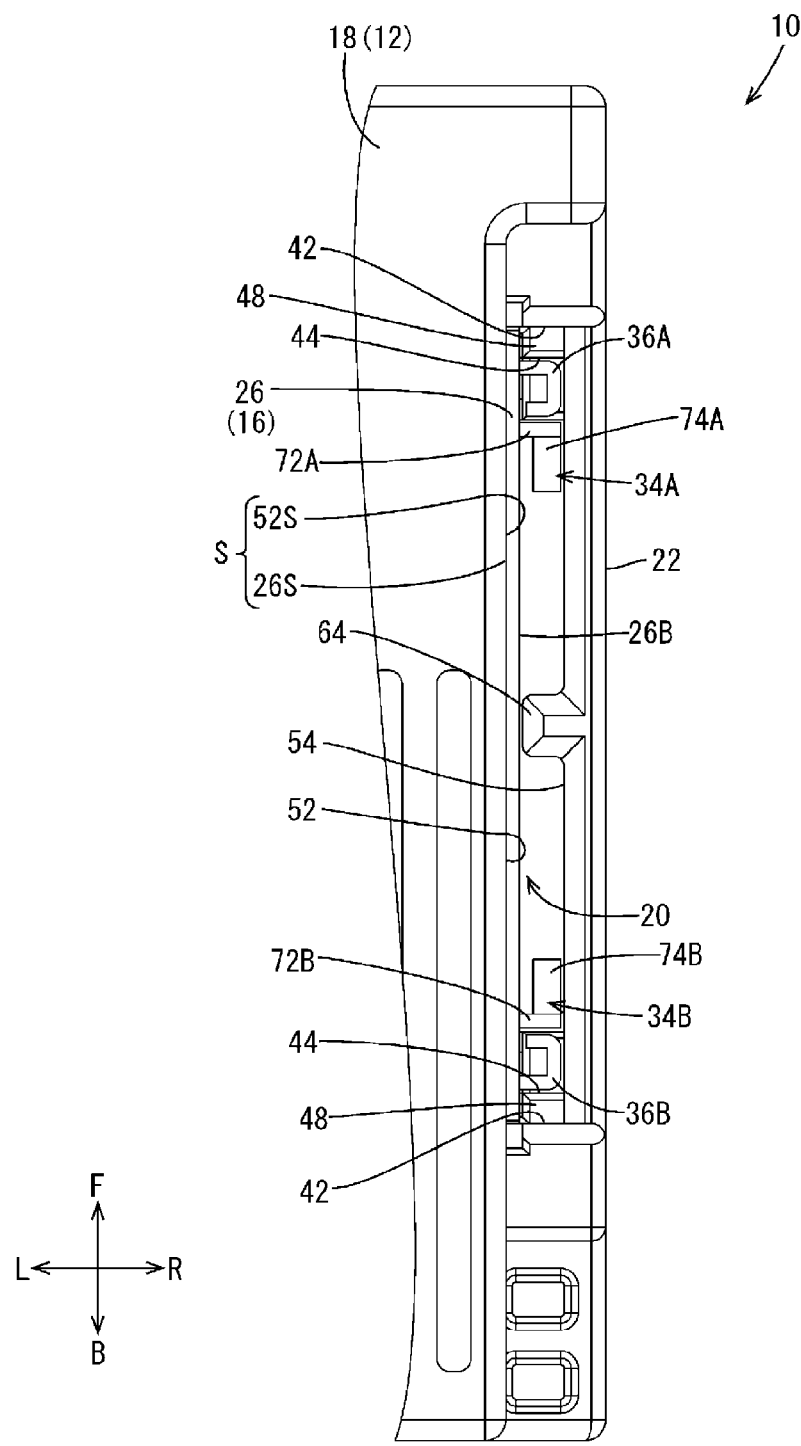
FIG. 3 is an enlarged view near a peg in FIG. 2.
Figure 4:
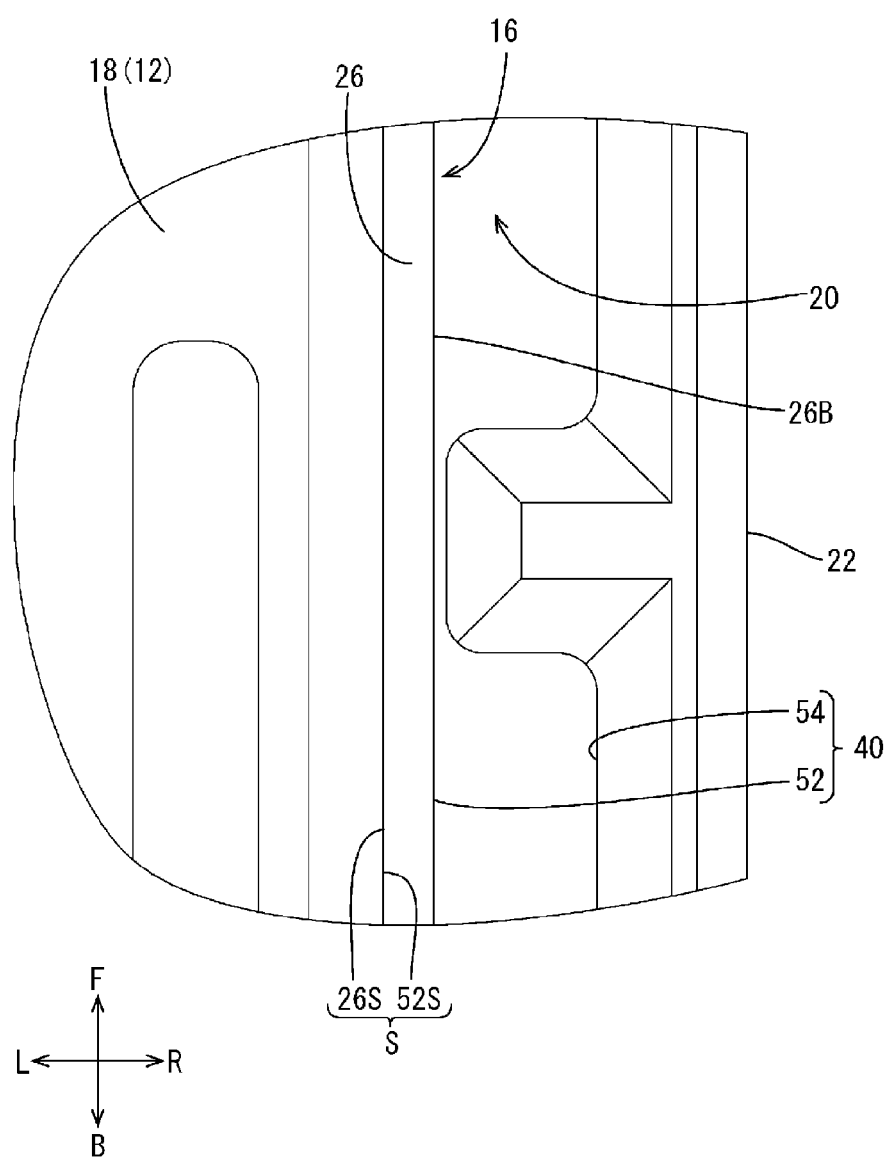
FIG. 4 is an enlarged view near a projection in FIG. 3.
Figure 5:
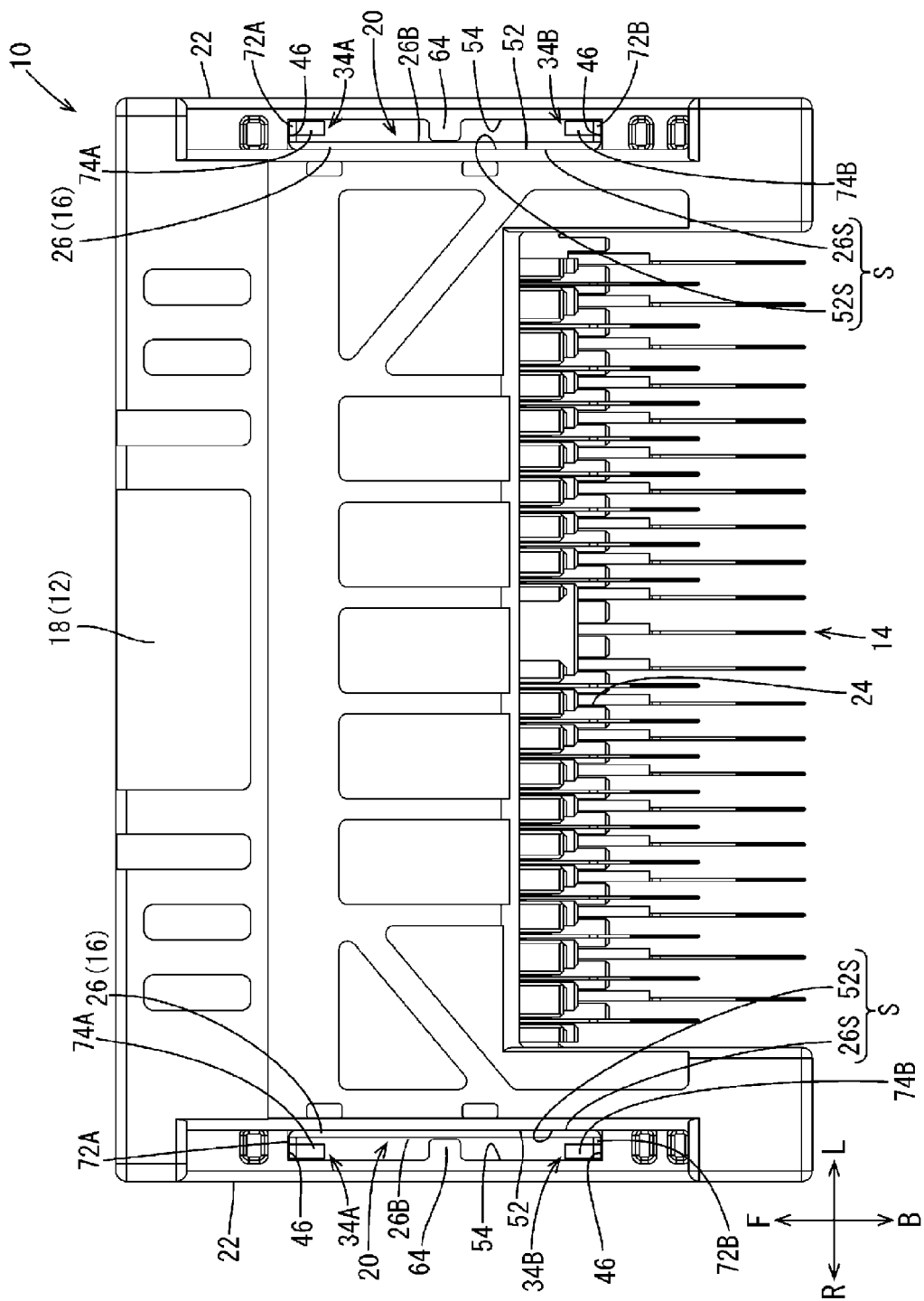
FIG. 5 is a bottom view of the connector.

As shown in FIG. 3, the fourth inner wall 52 and the peg body portion 26 are in surface contact with each other via contact surfaces S. Out of the contact surfaces S of the fourth inner wall 52 and the peg body portion 26, the surface on the side of the fourth inner wall 52 in contact with the peg body portion 26 serves as a housing-side contact surface 52S and the surface on the side of the peg body portion 26 in contact with the fourth inner wall 52 serves as a peg-side contact surface (fixing portion-side contact surface) 26S.

The fifth inner wall 54 is provided with a first projection (projection) 64 projecting toward the fourth inner wall 52 as shown in FIGS. 2 and 7. As shown in FIG. 1, the first projection 64 is shaped to be long in the vertical direction.

By providing the first projection 64, the first projection 64 contacts a back surface 26B if the peg 16 is going to be rolled and deformed in a direction from the peg-side contact surface 26S toward the back surface 26B. Thus, the rolling deformation of the peg 16 can be suppressed.

Figure 6:
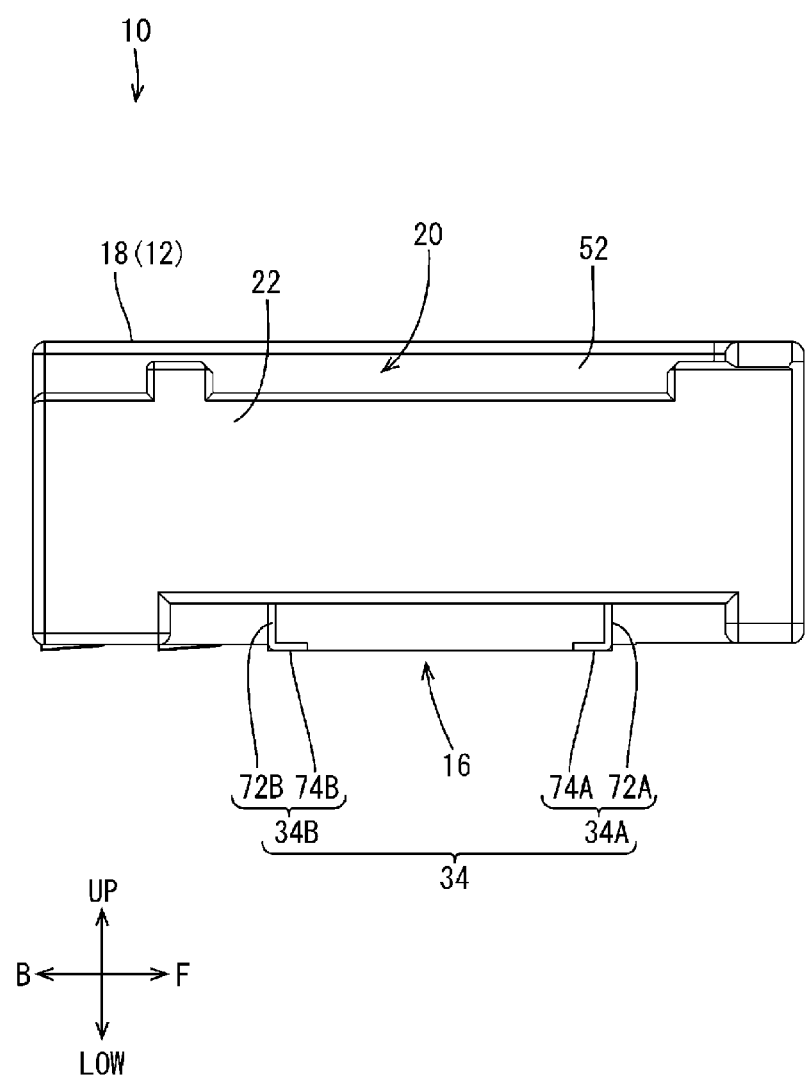
FIG. 6 is a side view of the connector.

As shown in FIG. 6, if the peg 16 is accommodated into the accommodating portion 20, the peg 16 is covered except at a lower end part of the peg body portion 26 and the pair of folded portions 34 by the protection wall 22, whereby the peg 16 can be protected by the protection wall 22.

Figure 14:
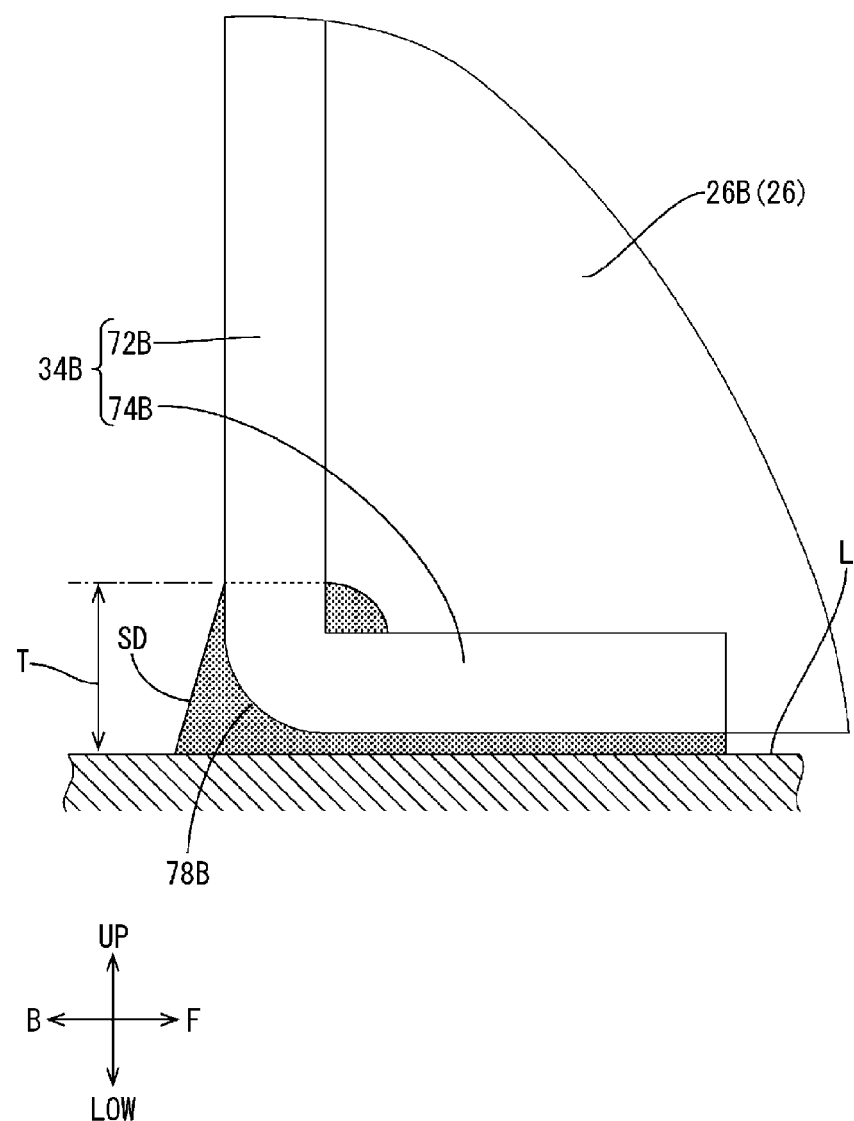
FIG. 14 is an enlarged front view near a folded portion in a soldered state.
Figure 15:
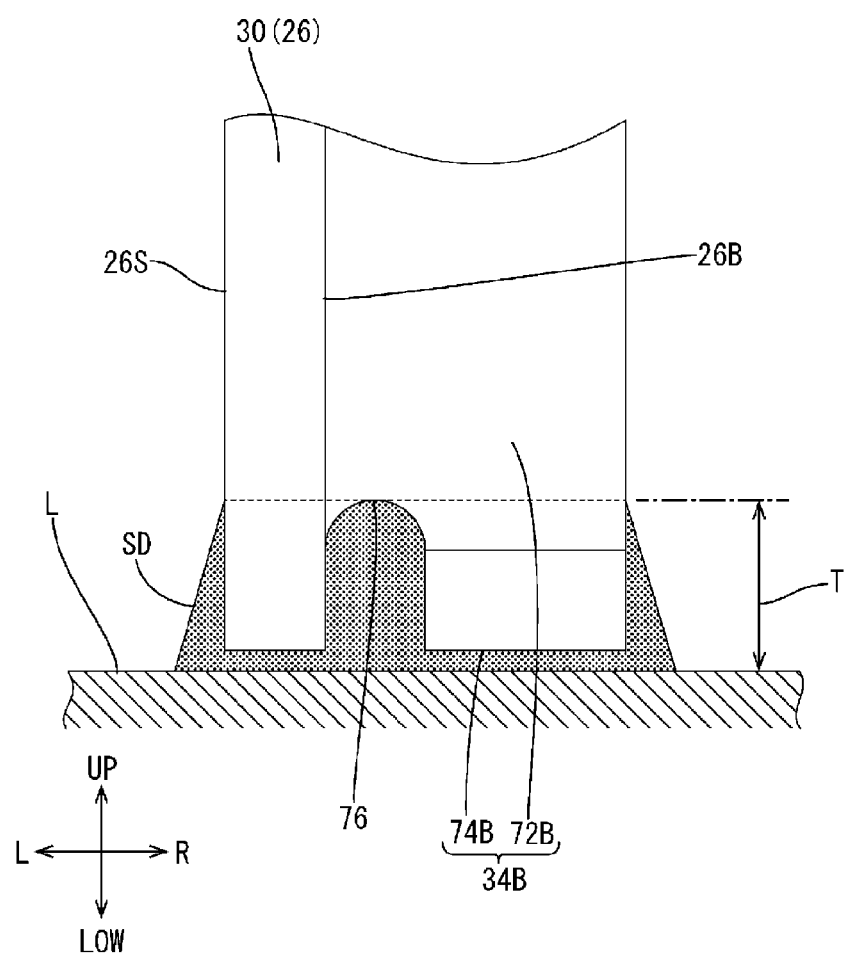
FIG. 15 is an enlarged left side view near the folded portion in the soldered state.
Figure 16:
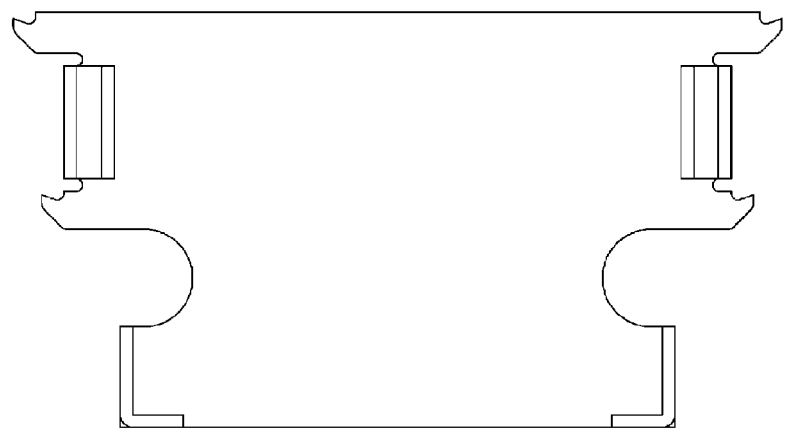
FIG. 16 is a front view of the peg.
Figure 17:
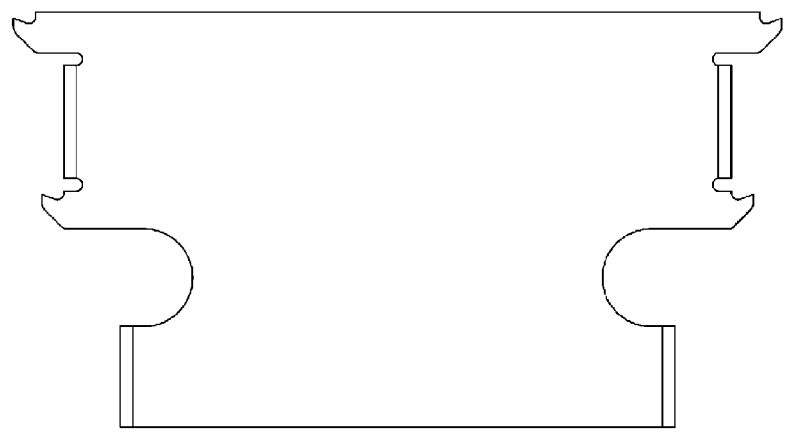
FIG. 17 is a back view of the peg.
Figure 18:
FIG. 18 is a plan view of the peg.
Figure 19:
FIG. 19 is a bottom view of the peg.

The lower end part of the peg body portion 26 and the lower surface of the bottom piece 74B are placed on the land L of the circuit board PCB and fixed by solder SD as shown in FIGS. 14 and 15. Similarly, although not shown, the lower surface of the bottom piece 74A is placed on the land L of the circuit board PCB and fixed by the solder. As just described, in fixing the peg 16 to the land L of the circuit board PCB, not only the lower end part of the peg body portion 26, but also the bottom pieces 74A, 74B are fixed by the solder SD. Thus, the peg 16 is less likely to be peeled off from the land L of the circuit board PCB as compared to a configuration in which only the lower end part of the peg body portion 26 is fixed. Further, since the bottom pieces 74A, 74B are not covered by the protection wall 22 as shown in FIG. 6, the bottom pieces 74A, 74B can be visually confirmed from a lateral side of the housing 12 and it can be confirmed whether or not the peg 16 is properly soldered and fixed.

As shown in FIG. 14, the lower surface of the bottom piece 74B is a flat surface (straight surface) parallel to the land L, and a contact area of the peg 16 and the solder SD is increased by providing the bottom piece 74B. The solder SD attached to the round portion 78B forms a fillet along the round portion 78B.

Figure 12:
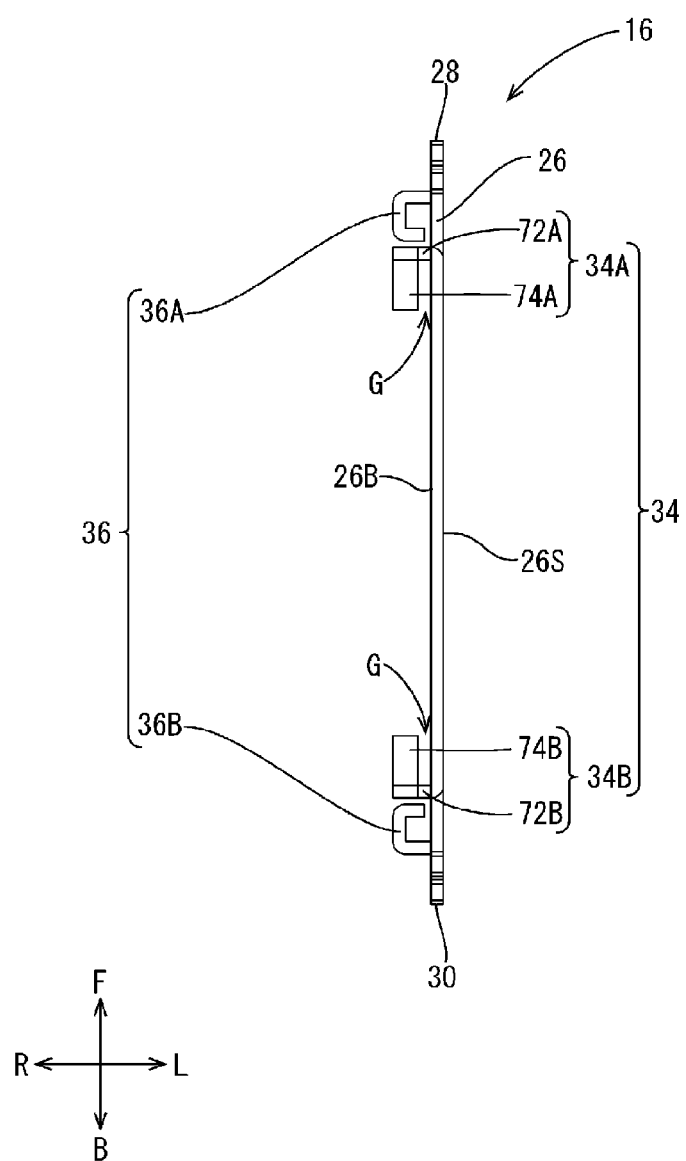
FIG. 12 is a bottom view of the peg.

As shown in FIGS. 11 and 12, a gap G is provided between the bottom piece 74B and the peg body portion 26, and the solder SD is easily accumulated in this gap G. At this time, the solder SD accumulated in the gap G flows to outside from the slit portion 76 shown in FIG. 13, whereby the accumulation of the solder SD in the gap G is suppressed and the solder SD easily spreads to the outer periphery of the peg body portion 26 such as the round portion 78B.

As shown in FIGS. 14 and 15, the solder SD having entered the slit portion 76 is sucked up into the slit portion 76 by a capillary phenomenon, and a fillet is formed up to the upper end position (back end position) T of the slit portion 76. At this time, since the upper end position T of the slit 76 is located above the round portion 78B, the fillet formed by the slit portion 76 is larger than that formed by the round portion 78B. By providing the slit portion 76 in this way, a larger fillet can be formed as compared to the case where the slit portion 76 is not provided.

As described above, according to this embodiment, the peg 16 has the peg-side contact surface 26S to be held in surface contact with the housing-side contact surface 52S of the housing 12 and the housing 12 is provided with the first projection 64 projecting toward the back surface 26B of the peg-side contact surface 26S. Thus, if the peg 16 is going to be rolled and deformed in the direction from the peg-side contact surface 26S toward the back surface 26B, the back surface 26B contacts the first projection 64, wherefore the rolling deformation of the peg 16 can be suppressed.

Further, since the peg 16 is provided between the housing-side contact surface 52S and the protection wall 22, the back surface 26B of the peg 16 is covered by the protection wall 22 and can be protected by the protection wall 22.

Further, since the bottom pieces 74A, 74B are placed in parallel to the land L of the circuit board PCB, a contact area with the land L of the circuit board PCB can be increased as compared to a configuration in which only an end part in an inserting direction of the peg 16 is placed on the land L of the circuit board PCB.

Further, since the round portion 78B is provided between the side piece 72B and the bottom piece 74B, the fillet of the solder SD for fixing the peg 16 and the land L of the circuit board PCB is formed along the round portion 78B. Further, since the slit portion 76 open in the inserting direction is provided in the end part of the side piece 72B on the side of the land L of the circuit board PCB, the solder SD is sucked up into the slit portion 76 by the capillary phenomenon and the fillet is formed over the entire slit portion 76. At this time, since the upper end position T on a side opposite to the land L of the circuit board PCB, out of the opening edge of the slit portion 76, is located more away from the land L of the circuit board PCB than from the round portion 78B, the fillet formed by the slit portion 76 is larger than that formed by the round portion 78B. By providing the slit portion 76 in this way, a larger fillet can be formed as compared to the case where the slit portion 76 is not provided.

Second Embodiment

A second embodiment is described with reference to FIGS. 23 to 33. In a connector 10A of this embodiment, the shape of a pair of folded portions 34E is different from that of the pair of folded portions 34 of the first embodiment. Further, a fifth inner wall 54 is provided with a pair of second projections 62 projecting toward a fourth inner wall 52.

Figure 32:
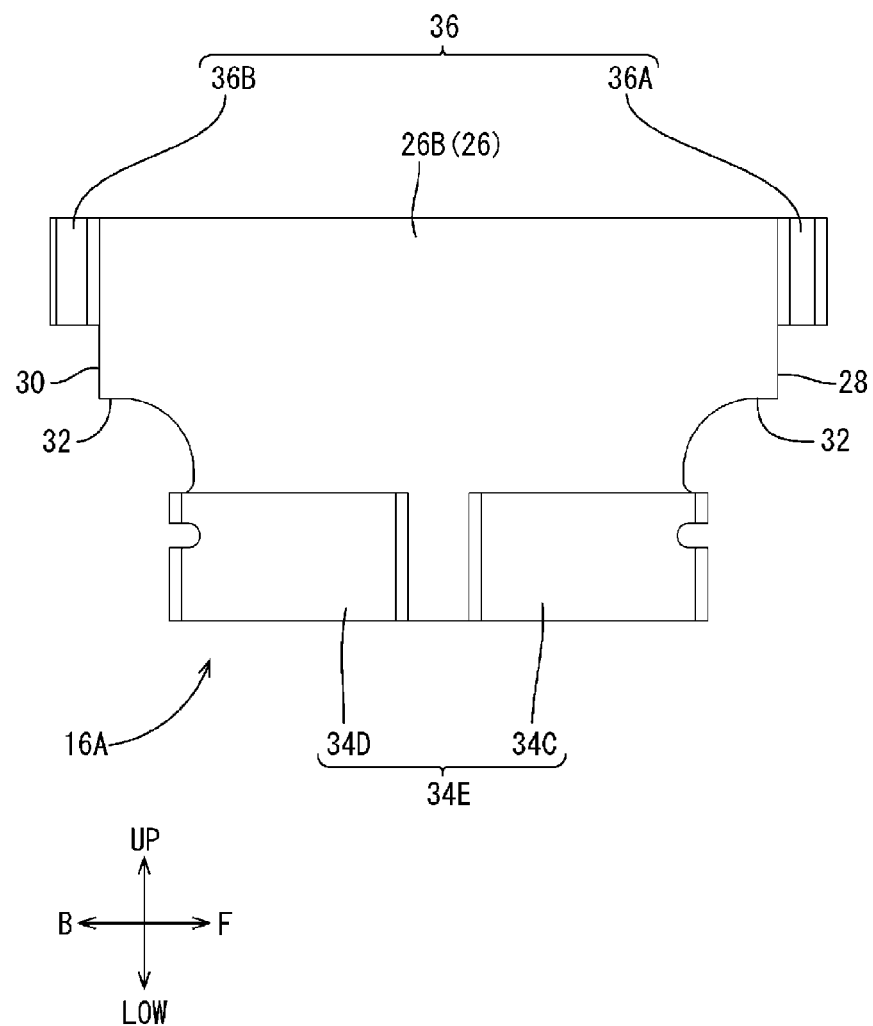
FIG. 32 is a front view of the peg.
Figure 33:
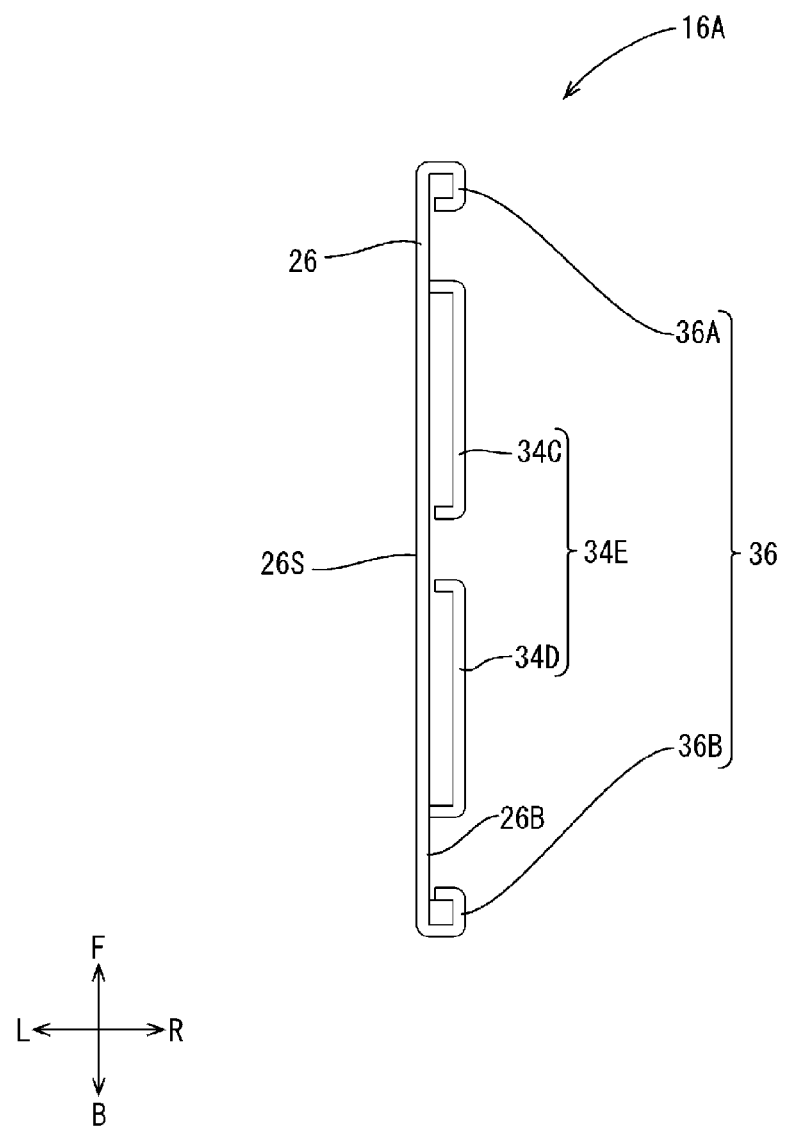
FIG. 33 is a side view of the peg.

Out of the pair of folded portions 34E, the folded portion on a front side (first folded portion) 34C is formed by being folded toward a back end side (other end part) 30 from a front end part (one end part) 28 of a peg body portion 26 and further having the tip thereof bent toward the peg body portion 26 as shown in FIGS. 32 and 33. Further, the folded portion on a back side (second folded portion) 34D is formed by being folded toward the front end part 28 from the back end part 30 of the peg body portion 26 and further having the tip thereof bent toward the peg body portion 26.

Figure 23:
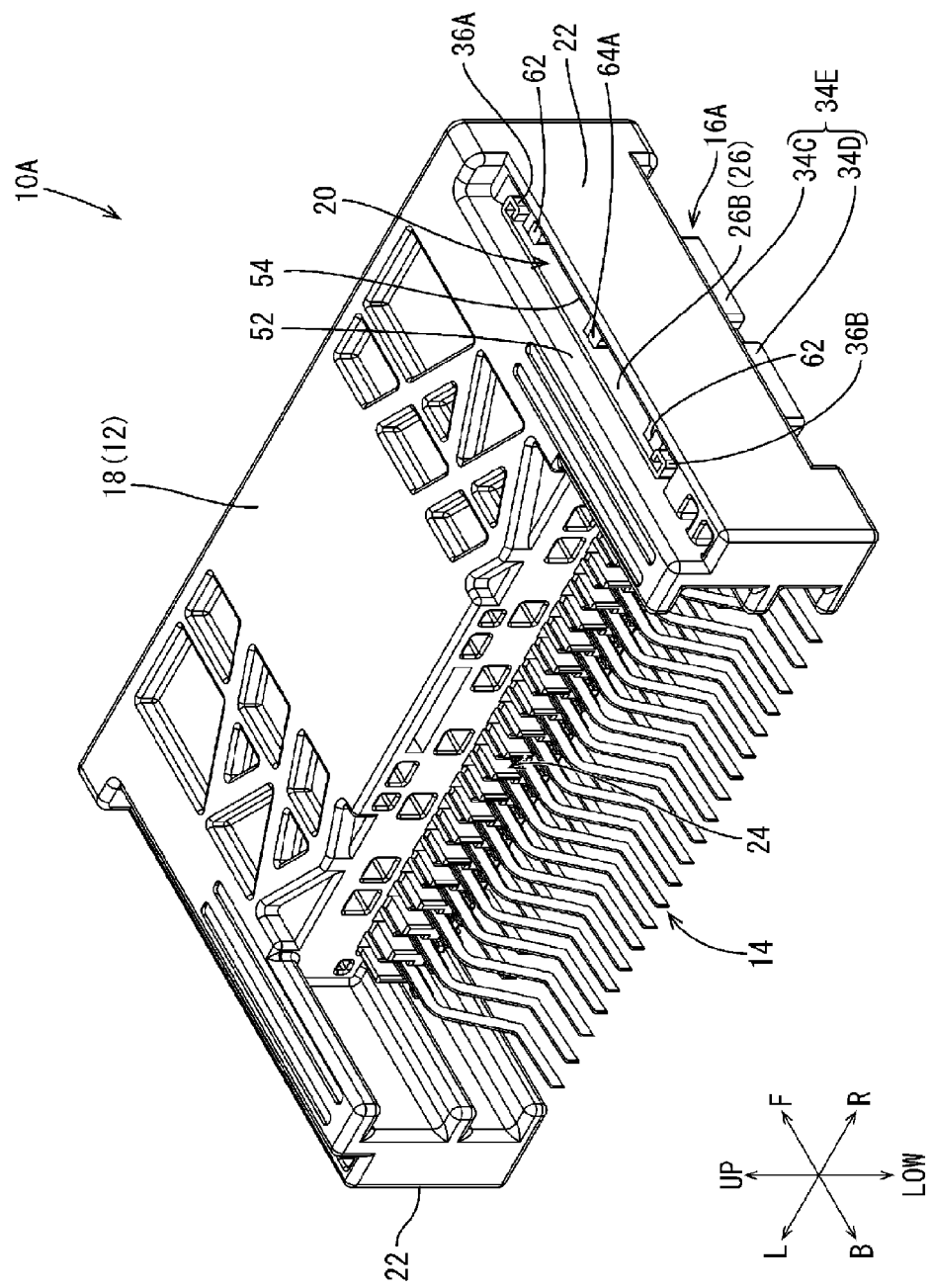
FIG. 23 is a perspective view of a connector of a second embodiment.
Figure 24:
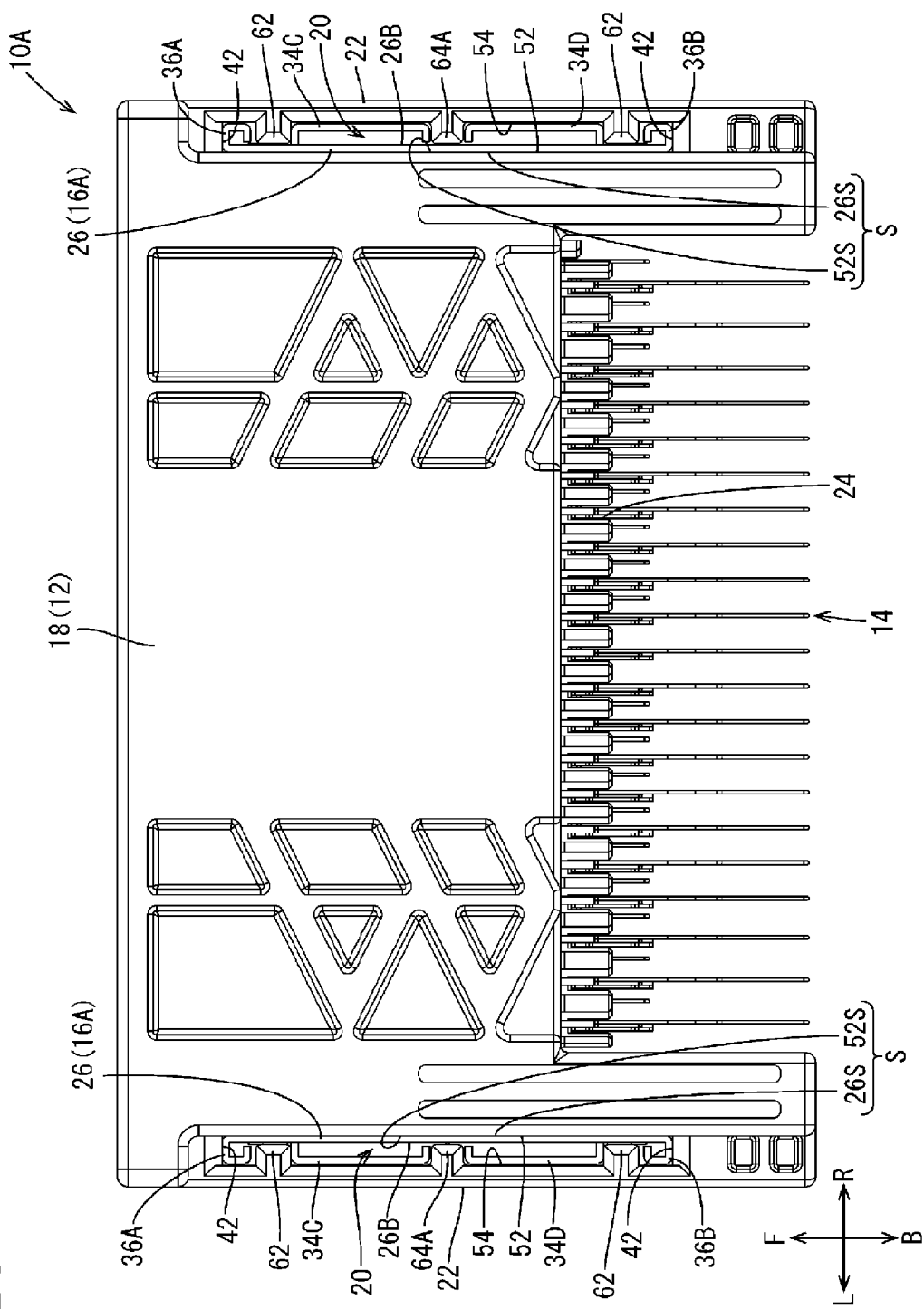
FIG. 24 is a plan view of the connector.
Figure 25:
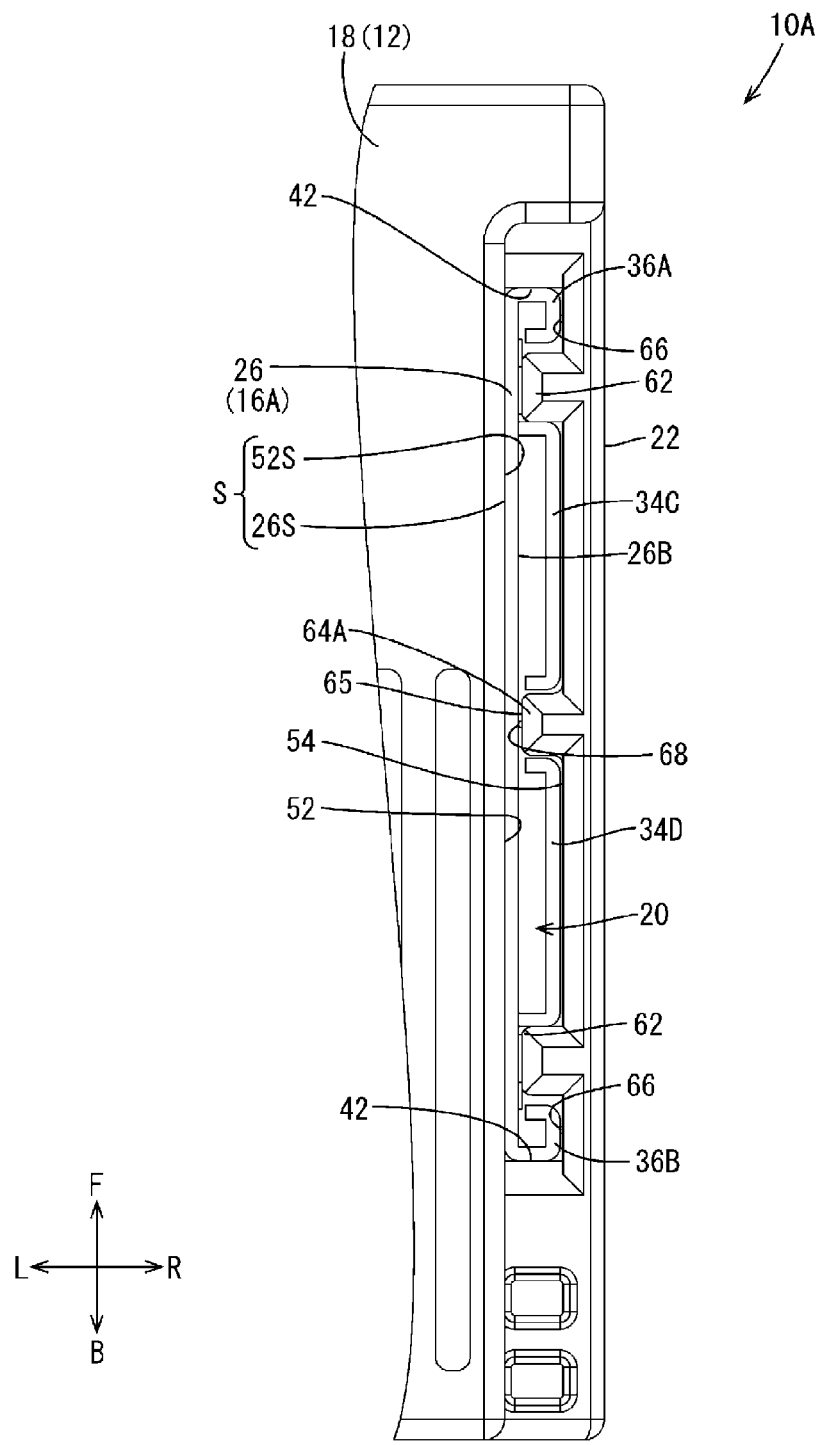
FIG. 25 is an enlarged view near a peg in FIG. 24.
Figure 26:
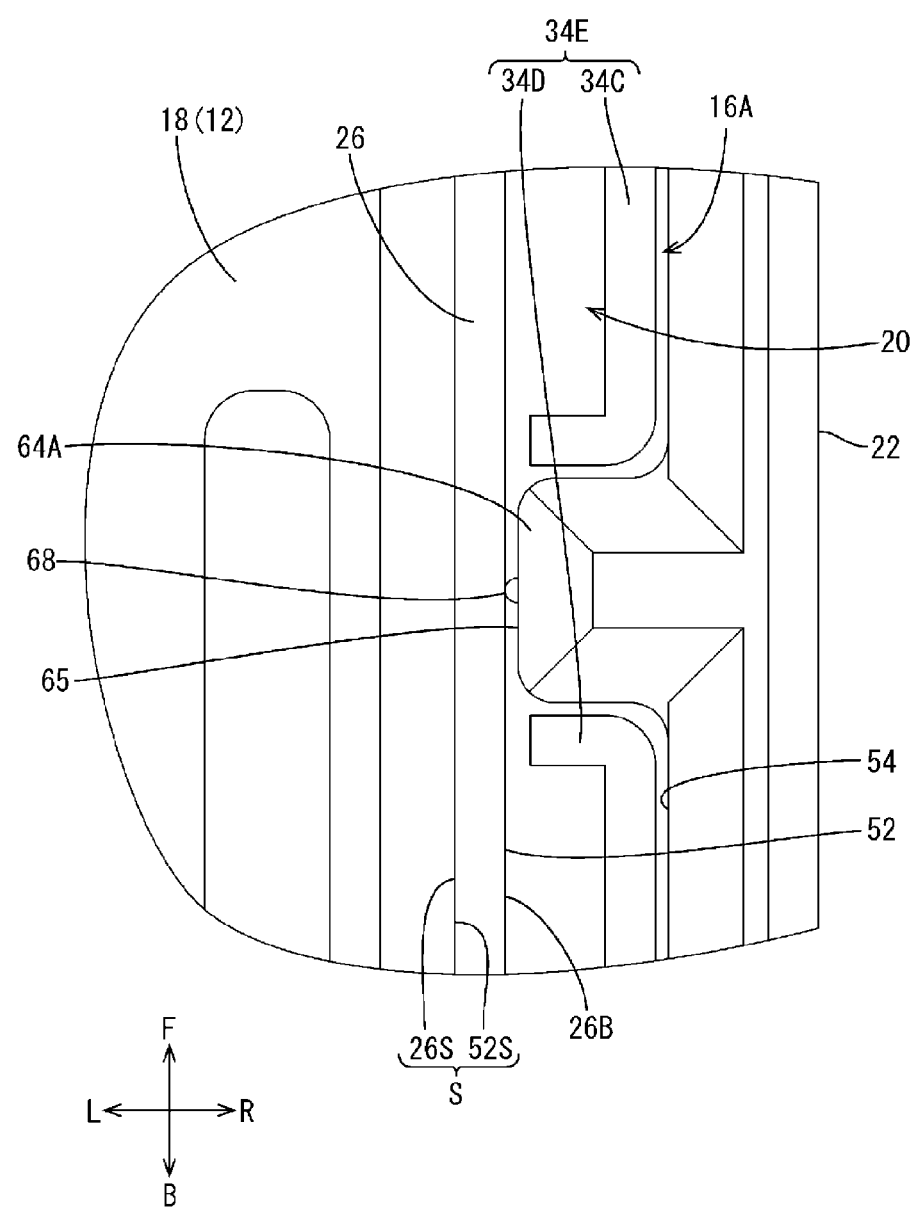
FIG. 26 is an enlarged view near a projection in FIG. 25.
Figure 27:
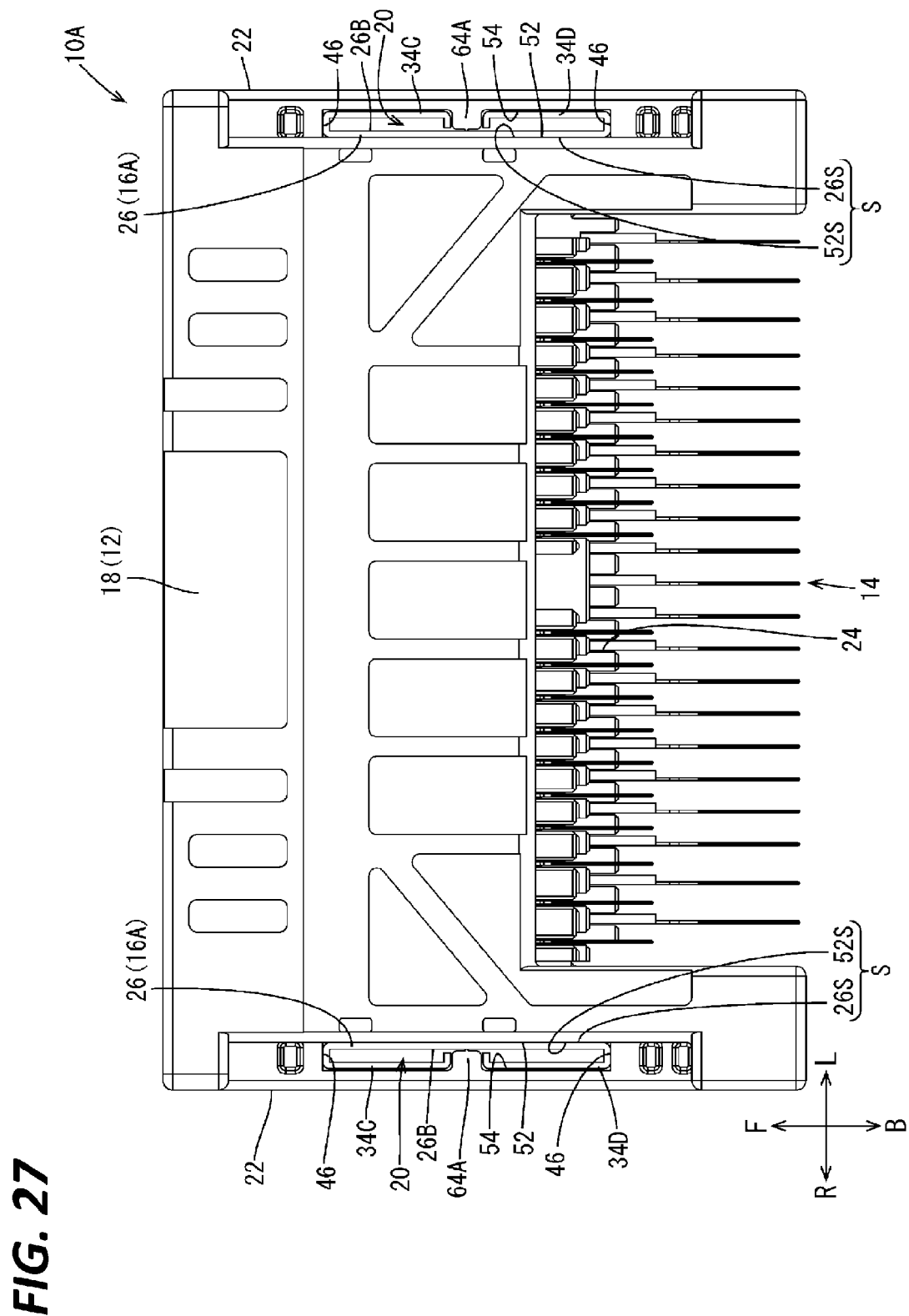
FIG. 27 is a bottom view of the connector.
Figure 29:
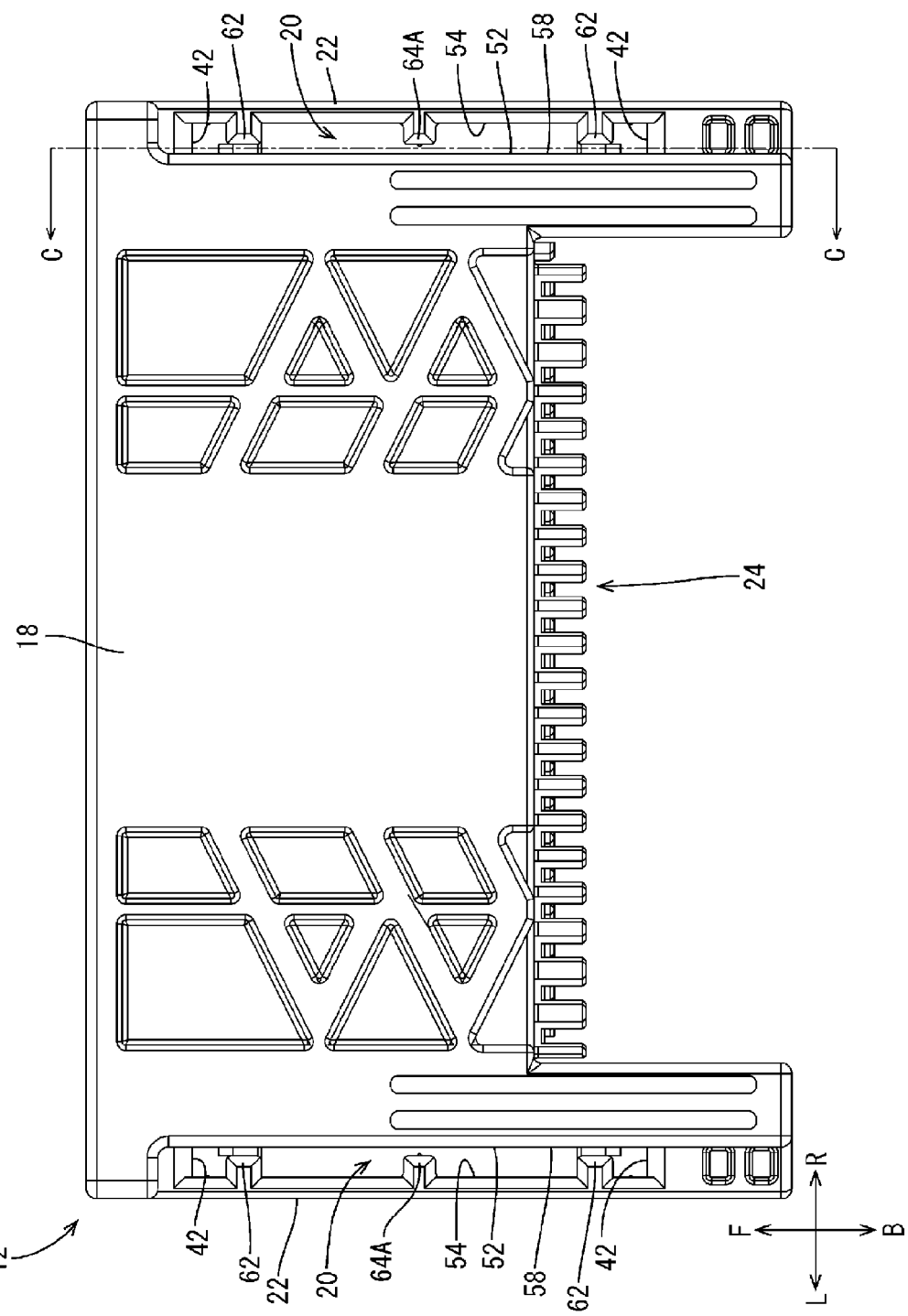
FIG. 29 is a plan view of the housing.

As shown in FIG. 24, the pair of second projections 62 are disposed at a predetermined distance from each other in a front-back direction, and a first projection 64A is disposed between the pair of second projections 62. As shown in FIG. 23, the pair of second projections 62 are shaped to be long in a vertical direction. As shown in FIGS. 25 and 26, the first projection 64A includes a projecting portion 65 projecting toward a back surface 26B of the peg body portion 26 from the fifth inner wall 54 and a first thread rib (thread rib) 68 provided on a tip part of the projecting portion 65. The first thread rib 68 has a linear shape long in the vertical direction.

As shown in FIG. 25, the fifth inner wall 54 is provided with a pair of second thread ribs 66 having a linear shape long in the vertical direction. The second thread rib 66 is provided between the second projection 62 and a first inner wall 42 on the fifth inner wall 54. Further, the pair of second thread ribs 66 are provided to correspond to the pair of second projections 62. The first thread rib 68 is linearly in contact with the back surface 26B, which is a surface on a side opposite to a peg-side contact surface 26S of the peg body portion 26, and the second thread ribs 68 are linearly in contact with a pair of bent portions 36A, 36B. In this way, the rolling deformation of the peg 16 from the peg-side contact surface 26S toward the back surface 26B can be prevented. Further, since the first thread rib 68 and the pair of second thread ribs 66 are squeezed by the peg 16 in inserting the peg 16 between the fourth inner wall 52 and the fifth inner wall 54 of an accommodating portion 20, the peg 16 can be reliably pressed.

When the peg 16 is accommodated into the accommodating portion 20, the pair of bent portions 36A, 36B are respectively located between the pair of first inner walls 42 and the pair of second projections 62 and the first projection 64A is located between the pair of folded portions 34E as shown in FIG. 25. The first projection 64A and the pair of second projections 62 are used to position the peg 16 in accommodating the peg 16 into the accommodating portion 20.

A lower end part of the peg body portion 26 and lower end parts of the pair of folded portions 34 are fixed to a land L of a circuit board PCB by solder SD. Since the other components are the same as in the first embodiment, these components are denoted by the same reference signs and not described.

As described above, according to this embodiment, since the first thread rib 68 configured to linearly contact the back surface 26B of the peg 16 is provided on the tip part of the first projection 64A, the first thread rib 68 is squeezed by the peg 16 in inserting the peg 16 between the housing-side contact surface 52S and a protection wall 22. Thus, the peg 16 can be reliably pressed.

Further, since the first projection 64A is located between the front folded portion 34C and the rear folded portion 34D of the peg 16, the first projection 64A can be used to position the peg 16 in inserting the peg 16 between the housing-side contact surface 52S and the protection wall 22.

Other Embodiments

The technique disclosed by this specification is not limited to the above described and illustrated embodiments. For example, the following various modes are also included.

(1) Although the first projection 64, 64A is provided on the protection wall 22 in the first and second embodiments, a cantilevered arm portion parallel to the peg body portion may be, for example, provided and the first projection may be provided on the tip of the arm portion.

(2) Although the lower end part of the peg body portion 26 and the lower end parts of the pair of folded portions 34 are soldered and fixed to the land L of the circuit board PCB in the first embodiment, only the lower end part of the peg body portion may be, for example, soldered and fixed to the land L of the circuit board PCB without providing the pair of folded portions 34.

(3) Although the first thread rib 68 is provided on the tip part of the projecting portion 65 of the first projection 64A and the fifth inner wall 54 is provided with the pair of second thread ribs 66 in the second embodiment, only either the first thread rib 68 or the pair of second thread ribs 66 may be, for example, provided.

LIST OF REFERENCE NUMERALS 10, 10A: connector
12: housing
16: peg (board fixing portion)
20: accommodating portion (both side portions)
22: protection wall
28: front end part (one end part)
30: back end part (other end part)
34A, 34C: front folded portion (first folded portion)

34B, 34D: back folded portion (second folded portion)
52S: housing-side contact surface
26S: peg-side contact surface (fixing portion-side contact surface)
64, 64A: first projection (projection)
65: projecting portion
68: first thread rib (thread rib)
72A: side piece
72B: side piece
74A: bottom piece
74B: bottom piece
76: slit portion
78: round portion
26B: back surface
T: back end position (upper end position)
L: land
PCB: circuit board

What is claimed is:

1. A connector to be mounted on a circuit board having lands, comprising:
a housing to be connected to a mating housing; and
a pair of board fixing portions to be respectively mounted into both side portions of the housing and soldered and fixed to the lands,
wherein:
the pair of board fixing portions respectively have fixing portion-side contact surfaces to be held in surface contact with a pair of housing-side contact surfaces located on both side surfaces of the housing,
the housing includes a pair of projections projecting toward back surfaces of the pair of board fixing portions on sides opposite to the fixing portion-side contact surfaces,
the board fixing portion is plate-like and inserted between the housing-side contact surface and the projection, and
the projection contacts the back surface of the board fixing portion to suppress deformation of the board fixing portion when the board fixing portion is deformed.

2. The connector of claim 1, wherein:
the housing includes a pair of plate-like protection walls provided to face the pair of housing-side contact surfaces,
the board fixing portion is provided between the housing-side contact surface and the protection wall, and
the pair of projections are provided to respectively project toward the pair of housing-side contact surfaces from the pair of protection walls.

3. The connector of claim 2, wherein:
the board fixing portion is inserted between the housing-side contact surface and the protection wall and an end part in an inserting direction of the board fixing portion is soldered and fixed to the land, and
the projection is composed of a projecting portion projecting toward the back surface of the board fixing portion and a thread rib provided on a tip part of the projecting portion, shaped to be long in the inserting direction of the board fixing portion and configured to linearly contact the back surface of the board fixing portion.

4. The connector of claim 3, wherein:
the board fixing portion includes:
a first folded portion formed by being folded from one end part toward another end part in a direction intersecting the inserting direction; and
a second folded portion formed by being folded from the other end part toward the one end part, and
the projection of the housing is located between the first folded portion and the second folded portion.

5. The connector of claim 2, wherein:
the board fixing portion is inserted between the housing-side contact surface and the protection wall and an end part in an inserting direction of the board fixing portion is soldered and fixed to the land,
the board fixing portion includes:
a first folded portion having a plate-like side piece formed by being folded in a direction intersecting the fixing portion-side contact surface from one end part in a direction intersecting the inserting direction; and
a second folded portion having a plate-like side piece formed by being folded in a direction intersecting the fixing portion-side contact surface from another end part in the direction intersecting the inserting direction and provided to face the first folded portion,
a bottom piece formed by being folded toward the second folded portion, disposed in parallel to the land and to be soldered and fixed to the land is provided on an end part facing the land on the side piece of the first folded portion, and
a bottom piece formed by being folded toward the first folded portion, disposed in parallel to the land and to be soldered and fixed to the land is provided on an end part facing the land on the side piece of the second folded portion.

6. The connector of claim 5, wherein:
a part between the side piece and the bottom piece is curved into a round portion,
a slit portion open in the inserting direction is provided in an end part on the land side of the side piece, and
a back end position on a side opposite to the land, out of an opening edge of the slit portion, is located more away from the land than from the round portion.

* * * * *